United States Patent [19]

Aronowitz

[11] Patent Number: 5,504,016
[45] Date of Patent: Apr. 2, 1996

[54] METHOD OF MANUFACTURING SEMICONDUCTOR DEVICE STRUCTURES UTILIZING PREDICTIVE DOPANT-DOPANT INTERACTIONS

[75] Inventor: Sheldon Aronowitz, San Jose, Calif.

[73] Assignee: National Semiconductor Corporation, Santa Clara, Calif.

[21] Appl. No.: 323,605

[22] Filed: Oct. 17, 1994

Related U.S. Application Data

[63] Continuation of Ser. No. 926,141, Aug. 5, 1992, abandoned, which is a continuation of Ser. No. 677,103, Mar. 29, 1991, abandoned.

[51] Int. Cl.$^6$ ............................. H01L 21/22; H01L 21/66
[52] U.S. Cl. ................................... 437/8; 437/151; 437/7
[58] Field of Search .................................. 437/987, 8, 7, 437/151; 148/DIG. 30, DIG. 32, DIG. 34, DIG. 36, DIG. 151, DIG. 152, DIG. 162; 364/490

[56] References Cited

U.S. PATENT DOCUMENTS

| | | | |
|---|---|---|---|
| 3,748,198 | 7/1973 | Base et al. | 437/151 |
| 3,867,203 | 2/1975 | Gesing et al. | 437/151 |
| 4,456,879 | 6/1984 | Kleinknecht | 437/8 |
| 4,589,936 | 5/1986 | Komatsu | 437/151 |
| 4,962,461 | 10/1990 | Meyer et al. | 437/8 |

OTHER PUBLICATIONS

Wolf, S., *Silicon Processing for the VLSI Era, vol. 2: Process Integration*, 1990, pp. 643–665, 684–690.
S. M. Hu et al., "On Models of Phosphorus Diffusion in Silicon", Journal of Applied Physics, vol., 54, No. 12, Dec. 1983.
F. F. Morehead, "Enhances Tail Diffusion of Phosphorous and Boron in Silicon: Self Interstitial Phenomena", Applied Physics Letter, vol. 48, No. 2, Jan. 13, 1986.
N. E. B. Cowern, "Analytical Description for the Diffusion of Recombination of Point Defects in Silicon", Applied Physics Letter, vol. 54, No. 15, Apr. 10, 1989.
A. F. W. Willoughby et al, "Diffusion of boron in Heavily Doped N and P Silicon", Journal of Applied Physics, vol. 59, No. 7, Apr. 1, 1986.
R. Deaton et al, "Diffusion Phenomena Due to Ion Implantation Damage and Arsenic and Phosphorous Co-Diffusion", Journal of Applied Physics, vol. 67, No. 4, Feb. 15, 1990.
J. C. C. Tsai, "Point Defect Generation During Phosphorous Diffusion in Silicon", Journal the Electrochemical Society: Solid State Science and Technology, vol. 134, No. 9, Sep. 1987.
B. J. Muluaney et al, "The Effect of Concentration–Dependent Defect Recombination on Phosphorous Diffusino and Silicon", Journal of Applied Physics, vol. 67, No. 6, Mar. 1990.
S. Aronowitz, "Dopant Diffusion Control in Silicon Using Germanium", Journal of Applied Physics, vol. 68, No. 7, Oct. 1, 1990.
S. Aronowitz, "Interstitial Interactions: Aluminum–boron, Aluminum–gallium, and boron–gallium pull effect", Journal of Applied Physics, vol. 61, No. 7, Apr. 1, 1987.

*Primary Examiner*—George Fourson
*Attorney, Agent, or Firm*—Limbach & Limbach

[57] ABSTRACT

The effect of dopant-dopant interaction on diffusion in silicon for a specific set of impurities is modeled. The first step in the modeling process involved quantum chemical calculations. The connection between the atomic scale results and macroscopic behavior was made through the medium for transmission of interactions between dopants. The molecular orbitals of the lattice system comprise that medium; consequently, interactions can be transmitted, with minimal reduction in magnitude, over separations of hundreds of lattice spacings. Macroscopically, additional flux components are generated that modify the conventional expression of Fick's second law. Detailed simulation of boron and phosphorus diffusion in germanium rich regions of silicon illustrate the power of this approach to successfully model and predict the complex behavior exhibited by a particular set of interacting dopant species.

12 Claims, 16 Drawing Sheets

METHOD OF MANUFACTURING SEMICONDUCTOR DEVICE STRUCTURES UTILIZING PREDICTIVE DOPANT-DOPANT INTERACTIONS

This is a continuation of application Ser. No. 07/926,141, filed on Aug. 5, 1992, now abandoned, which in turn is a file-wrapper-continuation of Ser. No. 07/677,103, filed Mar. 29, 1991, now abandoned.

BACKGROUND OF THE INVENTION

The present invention relates to the manufacture of semiconductor device structures and, in particular, to a method of manufacturing such structures utilizing quantitative simulation of the effect of dopant-dopant interactions on dopant diffusion.

The difficulty of modeling defect interactions in a semiconductor material is well known. Even the deceptively simple detailing of single dopant diffusion in silicon, a material that has undergone extensive investigation because of its widespread use in the integrated circuit industry, involves invocation of a host of complex defect mechanisms. See, for example, S. M. Hu, et al., "On Models of Phosphorous Diffusion in Silicon", Journal of Applied Physics, Vol. 54, No. 12, December 1983; F. F. Morehead, "Enhanced Tail Diffusion of Phosphorous and Boron in Silicon: Self Interstitial Phenomena", Applied Physics Letter, Vol. 48, No. 2, Jan. 13, 1986; and N. E. B. Cowern, "Analytical Description for the Diffusion and Recombination of Point Defects in Silicon", Applied Physics Letter, Vol. 54, No. 15, Apr. 10, 1989.

Heretofore, attempts to detail dopant diffusion in regions where several species of impurities have overlapping populations has been avoided. Prediction of the behavior of these multiple dopant systems has been made by extrapolating from single dopant behavior to the multiple dopant domain.

Extension of current models of single dopant diffusion invoke a host of ameliorating couplings with vacancies or interstitials or both to produce varying degrees of suitable explanations of experimental results. See, for example, A. F. W. Willoughby, et al., "Diffusion of Boron in Heavily Doped N and P Type Silicon", Journal of Applied Physics, Vol. 59, No. 7, Apr. 1, 1986 and R. Deaton, et al., "Diffusion Phenomena Due to Ion Implantation Damage and Arsenic and Phosphorous Co-Diffusion", Journal of Applied Physics, Vol. 67, No. 4, Feb. 15, 1990.

It must be emphasized that even single dopant modeling, using standard approaches, presents a maze of conflicting interpretations (see, for example, Morehead et al, "Enhanced 'Tail' Diffusion of Phosphorous and boron in Silicon: Self-Interstitial Phenomena", Appl. Phys. Left. 48, 151 (1986) and J. C. C. Tsai et al., "Point Defect Generation During Phosphorous Diffusion in Silicon", J. Electrochem. Soc. 134, 2348 (1987), as well as extensive sets of coupling arrangements (see, for example, B. J. Mulvaney, et al., "The Effect of Concentration-Dependent Defect Recombination Reactions on Phosphorous Diffusion and Silicon", Journal of Applied Physics, Vol 67, No 6, Mar. 15, 1990.

The difficulty resides in the fact that the explanations are made after the fact and are done as each new experiment produces unanticipated results (see, for example, Willoughby, et al., and Deaton, et al.).

SUMMARY OF THE INVENTION

The present invention provides a fully three-dimensional mechanism that can explicitly simulate and model dopant diffusion through regions in a semiconductor where several dopant species have overlapping populations that interact with each other. Macroscopically, additional flux components are generated for each diffusion species. Simulations of boron and phosphorous in germanium-rich regions in silicon provide excellent agreement with experiment, while boron-gallium simulations, which also provide a good agreement with experiment, illustrate the success of the methodology to deal with relatively fast diffusing dopant species that are also strongly interacting. The mechanism, at present, is the only one available that is capable of dealing with a dopant diffusion when dopant-dopant interactions are not negligible.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

I. Overview

Figure 1:
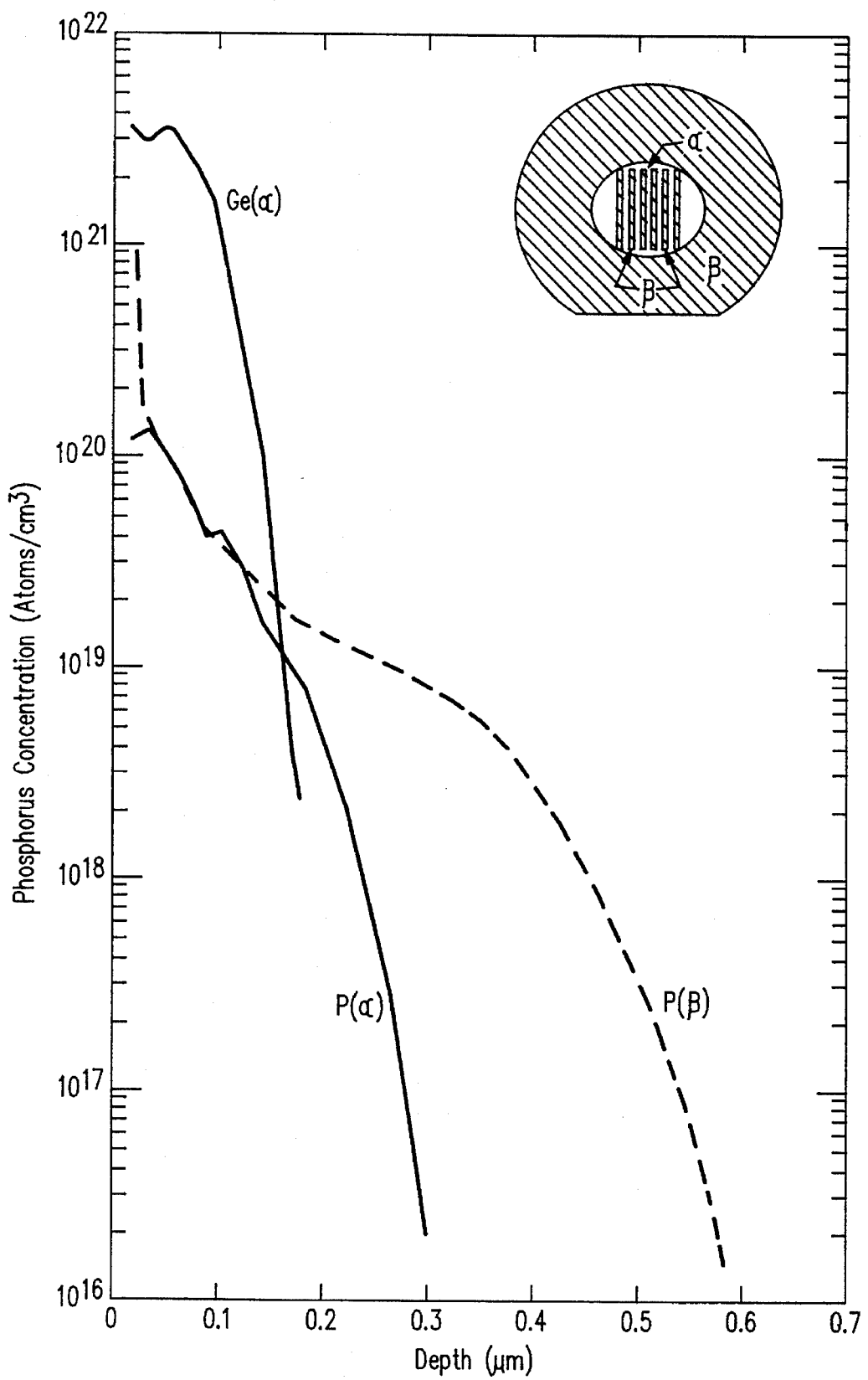
FIG. 1 is a graph illustrating secondary ion mass spectrometry (SIMS) chemical profiles of electrically active phosphorous with the "$\alpha$" (germanium present) and "$\beta$" (germanium absent) regions.

Based on quantum chemical calculations on model structures, the following assertions are made:

Atomic species that can be incorporated into the lattice system of a material that has a valence band composed of delocalized molecular orbitals will interact with each other. These interactions can be conveyed by the molecular orbitals of the host system, essentially undiminished, over macroscopic distances.

Macroscopic treatment of the forces that arise between dopant species in a host material can be formulated. The force of interaction on one dopant, arising from a second dopant species, is directly related to the net integrated difference of the distribution of the second species. Diffusion of the first species also is modified because of the interactive forces.

Similar considerations apply to the behavior of the second species.

This mutual modification to diffusion behavior of several dopant species in regions where they have overlapping populations can be cast into forms explicitly suitable for numerical evaluation.

II. Theory

The domain of the host material possessing a valence band comprised of delocalized molecular orbitals is assumed to extend from $0 \leq u \leq X$, $-Y \leq v \leq Y$, $-Z \leq w \leq Z$. At any time $t$, the distribution of dopant B, $g_B(u,v,w,t)$ satisfies the condition that $$\int_0^X du \int_{-Y}^Y dv \int_{-Z}^Z dw\, g_B(u,v,w,t) = 1. \quad (1)$$

This ensures the completeness of accounting for the presence of dopant B. It is stipulated that the net forces on dopant A at point $(x,y,z)$ at time $t$ in the host material arising from the interactions with all of dopant B is given by:

$$\vec{F}_{A(B)}(x,y,z,t) = \quad (2)$$

$$f_{A(B);u}\left\{ \int_{-Y}^Y dv \int_{-Z}^Z dw \left[ \int_0^x g_B du - \int_x^X g_B du \right] \right\} \vec{a} +$$

$$f_{A(B);v}\left\{ \int_0^X du \int_{-Z}^Z dw \left[ \int_{-Y}^y g_B dv - \int_y^Y g_B dv \right] \right\} \vec{b} +$$

$$f_{A(B);w}\left\{ \int_0^X du \int_{-Y}^Y dv \left[ \int_{-Z}^z g_B dw - \int_z^Z g_B dw \right] \right\} \vec{c}.$$

$\vec{a}$, $\vec{b}$, $\vec{c}$ are unit direction vectors. $f_{A(B);u}$, $f_{A(B);v}$, $f_{A(B);w}$ are force factors; they represent averaged macroscopic force components. However, in this formulation they are used as adjustable parameters to be determined for a given set of interacting dopant species. Equation (2) stipulates that the net force on dopant A due to interactions with dopant B involves components of the integrated difference in the distribution of dopant B over the entire domain.

In turn, this force generates an additional term in the flux density of A. This additional term due to the interaction between A at $(x,y,z,t)$ with dopant B equals $$\vec{J}_{A(B)}(x,y,z,t) = D_A C_A \vec{F}_{A(B)}/\kappa T. \quad (3)$$

$D_A$ is the diffusion coefficient of dopant A; $C_A$ is the concentration at time $t$ of that species at $(x,y,z)$. All interactions with B are contained in the effective force $\vec{F}_{A(B)}$. T is the absolute temperature of the system; $\kappa$ is the Boltzmann constant. The contributions to the continuity equation because of $\vec{J}_{A(B)}$ are given by the dot product $$-\vec{\nabla} \cdot \vec{J}_{A(B)}.$$

The complete expression of Fick's second law for the diffusion of species A equals $$\frac{\partial C_A}{\partial t} = \vec{\nabla} \cdot (D_A \vec{\nabla} C_A) - \vec{\nabla} \cdot \vec{J}_{A(B)}. \quad (4)$$

The distribution of dopant A affects and alters the diffusion of dopant B. An expression similar to the continuity expression for A now can be readily written for B:

$$\frac{\partial C_B}{\partial t} = \vec{\nabla} \cdot (D_B \vec{\nabla} C_B) - \vec{\nabla} \cdot \vec{J}_{A(B)}. \quad (5)$$

In general, for K dopant species that have overlapping populations in a region of the host material, $$\frac{\partial C_A}{\partial t} = \vec{\nabla} \cdot (D_A \vec{\nabla} C_A) - \sum_{\substack{I=B \\ I \neq A}}^{K} \vec{\nabla} \cdot \vec{J}_{A(I)} \quad (6)$$

$$\vdots$$

$$\frac{\partial C_K}{\partial t} = \vec{\nabla} \cdot (D_K \vec{\nabla} C_K) - \sum_{\substack{I=A \\ I \neq K}}^{J} \vec{\nabla} \cdot \vec{J}_{K(I)}$$

A method that decouples the time sequence can be introduced by stipulating, at time $t = N\nabla t$, the diffusion of A is calculated holding the distributions of species B, ..., K constant. The distribution of B is obtained from the solution of the continuity equation for that dopant at time $t=(N-1/K)\Delta t$ with the distributions of A, C, ..., K held constant. Similarly, the distribution of species C is determined at time $(N-2/K)\Delta t$ with the distributions of A, B, D, ..., K held constant. The distribution of A, used to determine diffusion characteristics of B at $t=(N-1/K)\Delta t$, C at $t=(N-2/K)\Delta t$, ..., K at $t=(N-((k-1)/K))\Delta t$, was calculated at $t=(N-1)\Delta t$. If $N\Delta t$ obeys the condition that $$\lim_{\substack{N \to \infty \\ \Delta t \to 0}} N\Delta t = \text{constant}$$

then, in the limit, the times $t_A = N\Delta t$, $t_B = (N-1/K)\Delta t$, ..., $t_K = (N-((K-1)/K))\Delta t$ become equal; that is, in the limit given above, the decoupling scheme becomes exact.

If B is uniform in $v$ and $w$ for any time, then the distribution function $g_B(u,v,w,t)$ may be written as the product of the individual distributions for each direction. In particular, $$g_B(v) = \frac{1}{2Y},$$

$$g_B(w) = \frac{1}{2Z},$$

to preserve uniformity. In turn, eq. (2) equals $$\vec{F}_{A(b)}(x,y,z,t) = f_{A(B);u}\left\{\int_0^x g_B(u,t)du - \int_x^X g_B(u,t)du\right\}\vec{a} +$$

$$f_{A(B);v}\left(\frac{y}{Y}\right)\vec{b} + f_{A(B);w}\left(\frac{z}{Z}\right)\vec{c}.$$

In the limit as Y, Z become very large, $$\lim_{\substack{Y\to\infty\\Z\to\infty}} \vec{F}_{A(B)}(x,y,z,t) = \qquad (8)$$

$$f_{A(B);u}\left\{\int_0^x g_B(u,t)du - \int_x^X g_B(u,t)du\right\}\vec{a}.$$

A one-dimensional diffusion program was written to test the concepts discussed above. The implicit method was used to generate the system of equations from discretization of the set in equation (6); Gaussian elimination was used to solve that system of equations. The method to decouple the time sequence, outlined above, was employed. Only diffusion in silicon was modelled. Outgassing, segregation between different materials (such as silicon and silicon dioxide) were not simulated.

For simplicity of demonstration and illustration only, the treatment will be confined to one-dimension and two dopant species.

III. Two Dopant Systems: Dopant B Distribution is Constant

The case where dopant A is diffusing under the influence of a time independent distribution of dopant B is represented by the phosphorus-germanium or boron-germanium system. FIG. 1 displays secondary ion mass spectrometry (SIMS) analyses for an experiment involving phosphorus. In the experiment, the wafer was implanted with germanium ($1.5 \times 10^{16}$ Ge/cm² at 80 keV) and annealed in nitrogen at 1000° C. for 30 minutes. A phosphorous implant followed ($1.5 \times 10^{15}$ P/cm² at 30 keV). The wafer was then annealed again in nitrogen at 900° C. for 30 minutes. P($\alpha$) denotes phosphorous from a region that had no photoresist. P($\beta$) denotes phosphorous from a region that was initially coated. Germanium is present only in $\alpha$ regions. The retarded diffusion with germanium present is dramatic.

Figure 2:
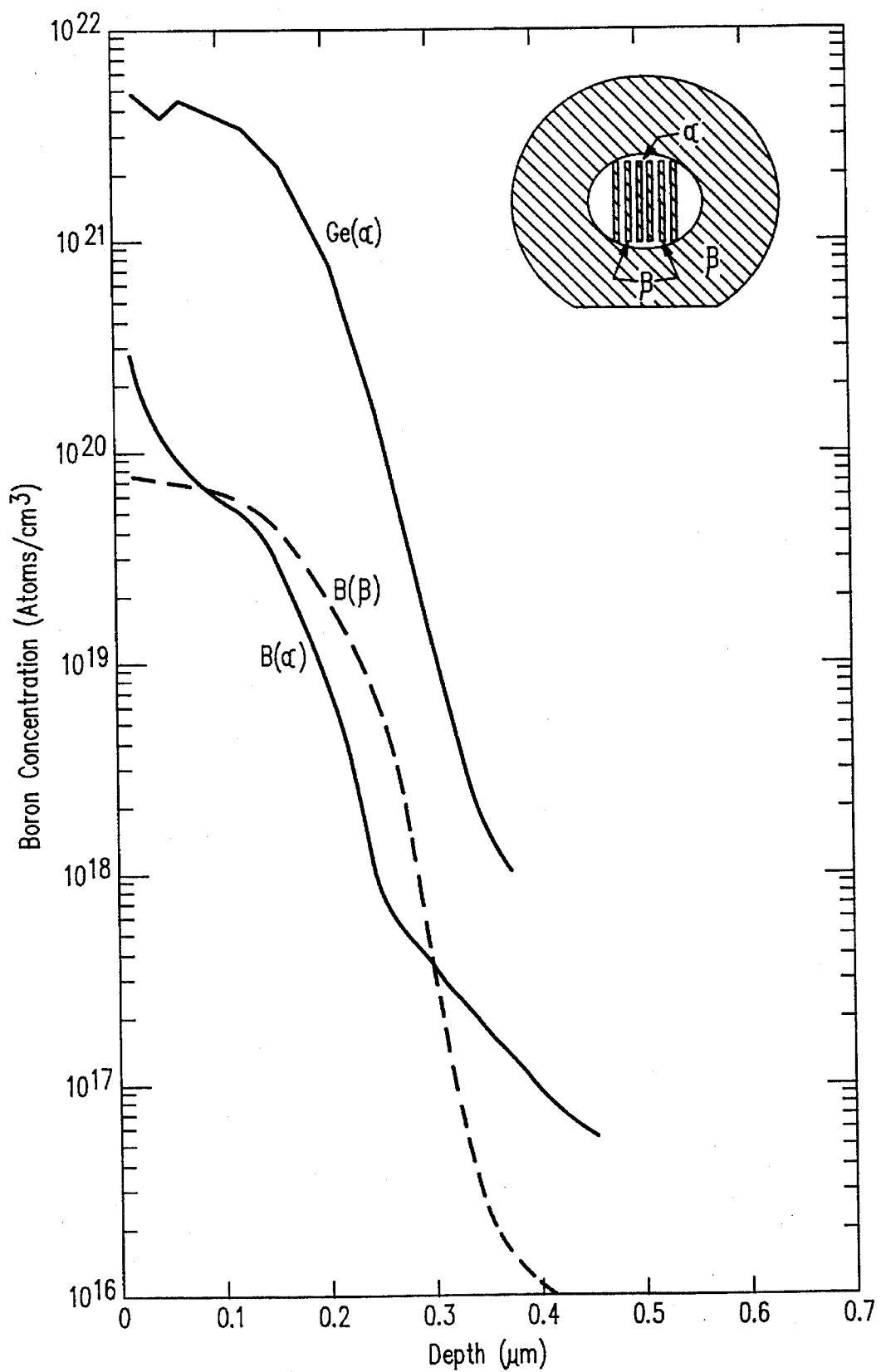
FIG. 2 is a graph illustrating a SIMS chemical profile of electrically active boron and germanium "$\alpha$" (germanium present) and "$\beta$" (germanium absent) regions.
Figure 3:
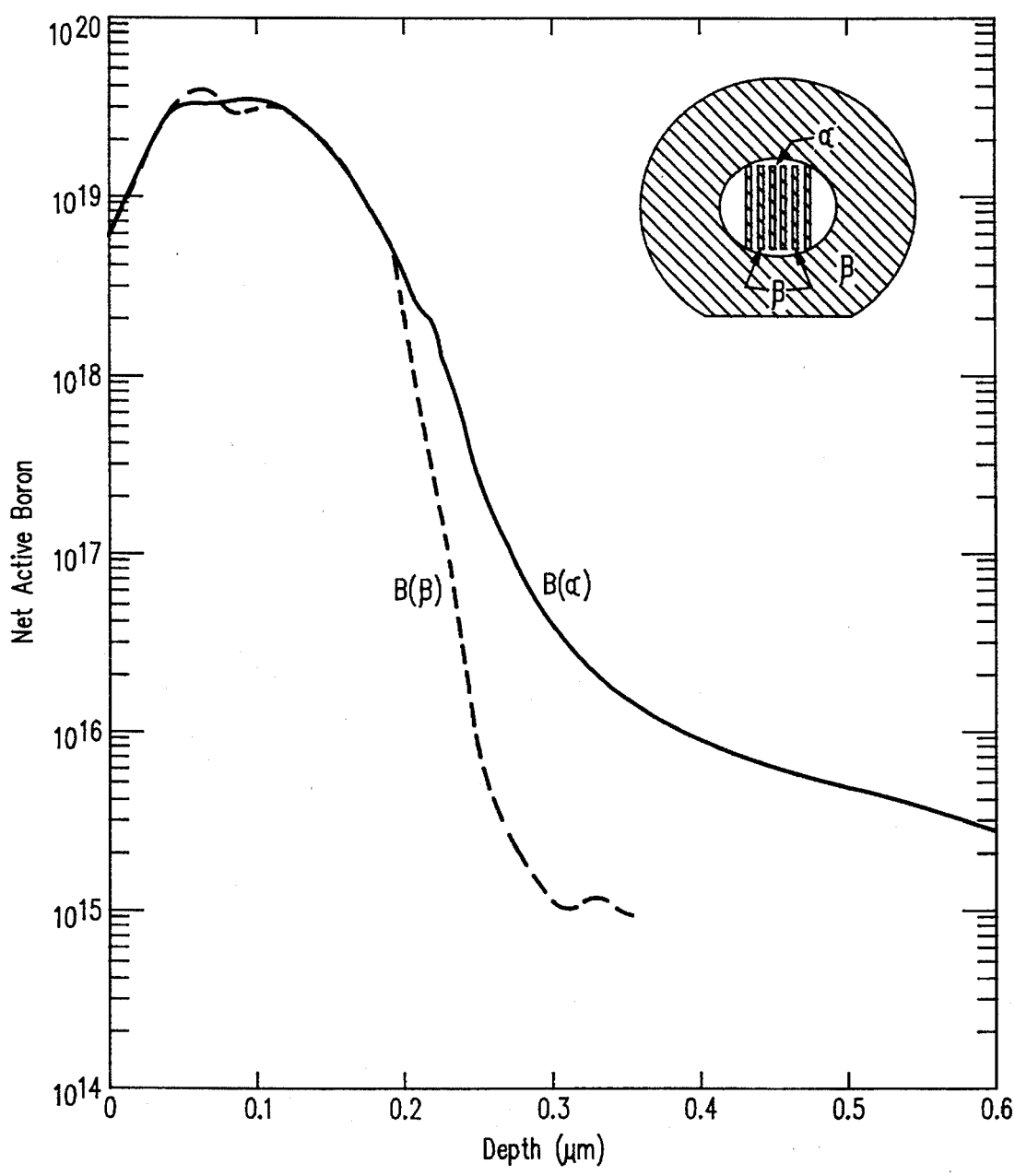
FIG. 3 is a graph illustrating spreading resistance profiling of the electrically active boron associated with the "$\alpha$" (germanium present) and "$\beta$" (germanium absent) regions.

FIG. 2 shows SIMS profiles for a boron experiment. In the boron experiment, the wafer was implanted with two doses of germanium. The first equalled $3.0 \times 10^{16}$ Ge/cm² at 180 keV; it was followed by a $1.5 \times 10^{16}$ Ge/cm² at 80 keV. The wafer was then annealed in nitrogen at 1000° C. for 30 minutes. $BF_2^+$ then was implanted ($1.5 \times 10^{15}$ $BF_2^+$ at 45 keV). A second anneal in nitrogen followed (900° C. for 30 minutes). $\alpha$ and $\beta$ labelling of regions connote the same as in FIG. 1. These results are complemented by spreading resistance profiling (SRP) of FIG. 3. The prominent tail associated with a germanium presence is substitutional upon comparing the result in FIG. 2 with that in FIG. 3. This is in striking accord with atomic scale calculations.

Figure 4:
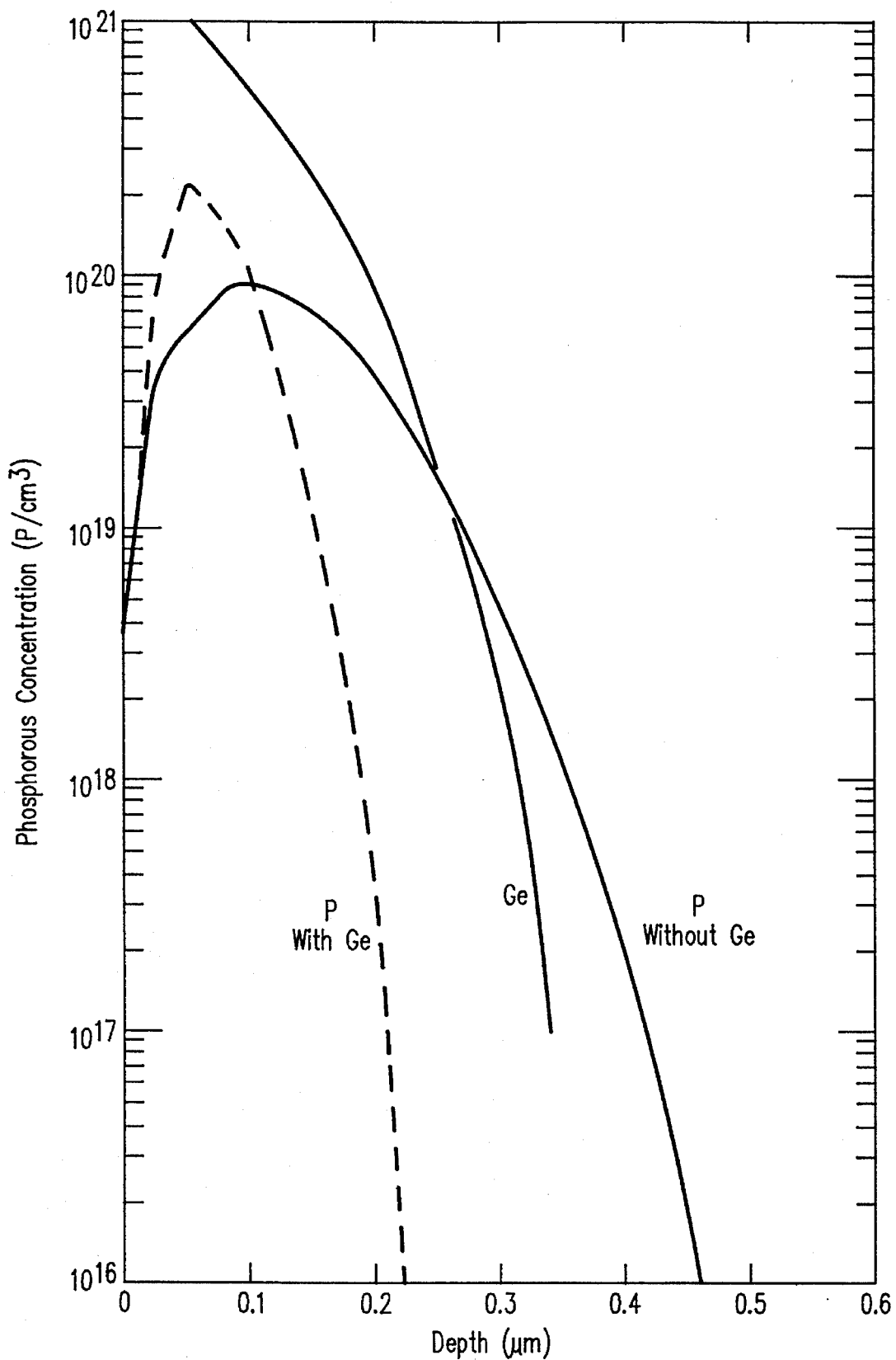
FIG. 4 is a graph illustrating simulated concentration profiles of the diffusion of phosphorous implants after anneal under neutral ambient conditions with germanium present and when germanium is absent.

The simulated results for phosphorus are displayed in FIG. 4. FIG. 4 show simulated concentration profiles of the diffusion of $1.5 \times 10^{15}$ P/cm², 30 keV phosphorous implants after a 900° C., 30 minute anneal under neutral ambient conditions when germanium is present and when germanium is absent. The germanium dose was $1.5 \times 10^{16}$ Ge/cm². The germanium distribution was generated from the expression:

$$g(u)=0.5\{\omega\exp(-\omega u)+2\phi\exp(-\phi u^2)\};\ \omega=3.4\times10^5;\ \phi=5.0\times10^9.$$

Figure 5:
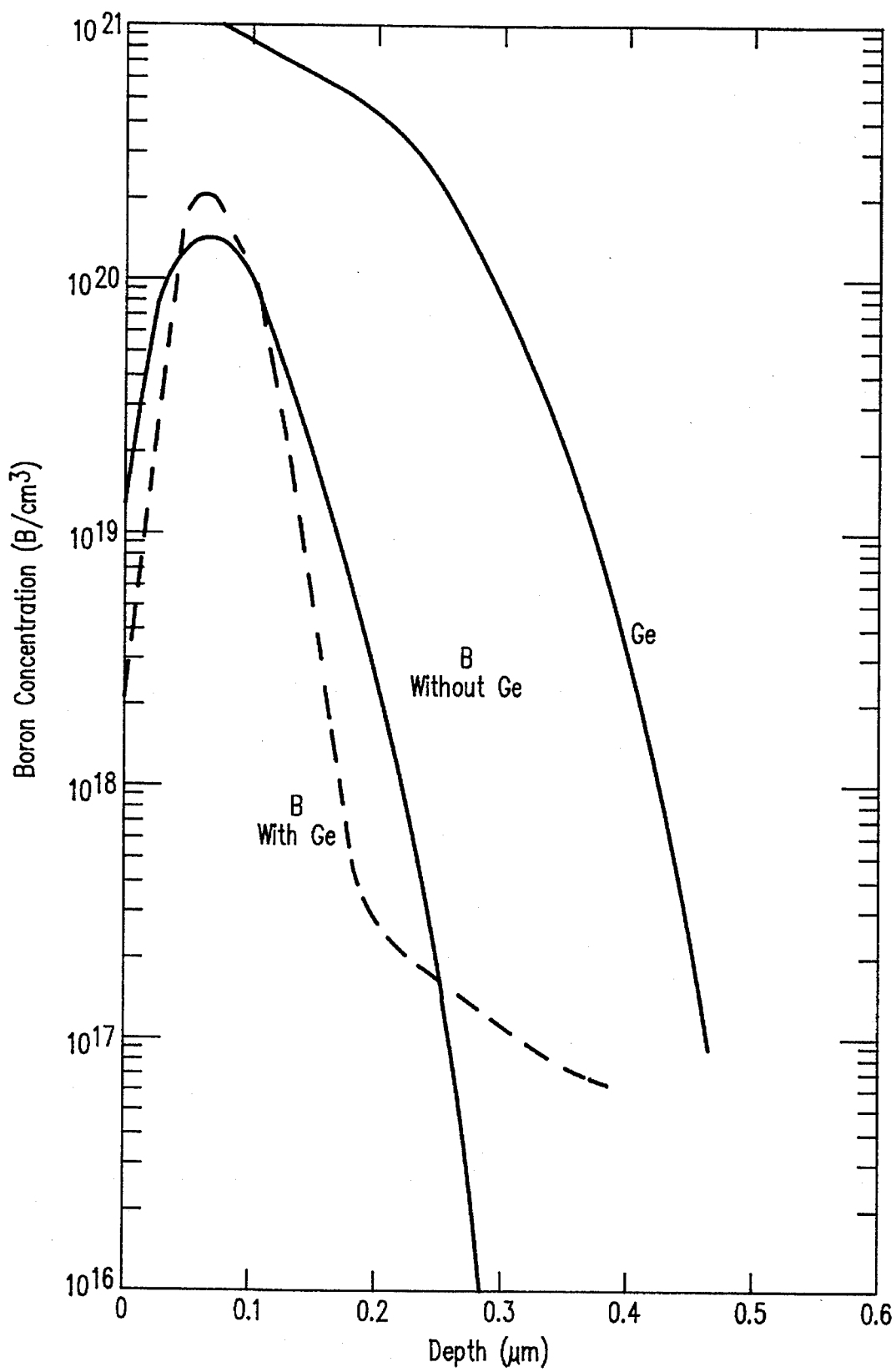
FIG. 5 is a graph illustrating simulated concentration profiles of the diffusion of boron implants annealed under neutral ambient conditions when germanium is present and when germanium is absent.

FIG. 5 shows simulated concentration profiles of the diffusion of $1.5 \times 10^{15}$ B/cm², 9 keV boron implants annealed at 900° C. for 30 minutes under neutral ambient conditions when germanium is present and when germanium is absent. The germanium dose was $2.5 \times 10^{16}$ Ge/cm². The germanium distribution was generated from the expression cited above in conjunction with FIG. 4.

Figure 6:
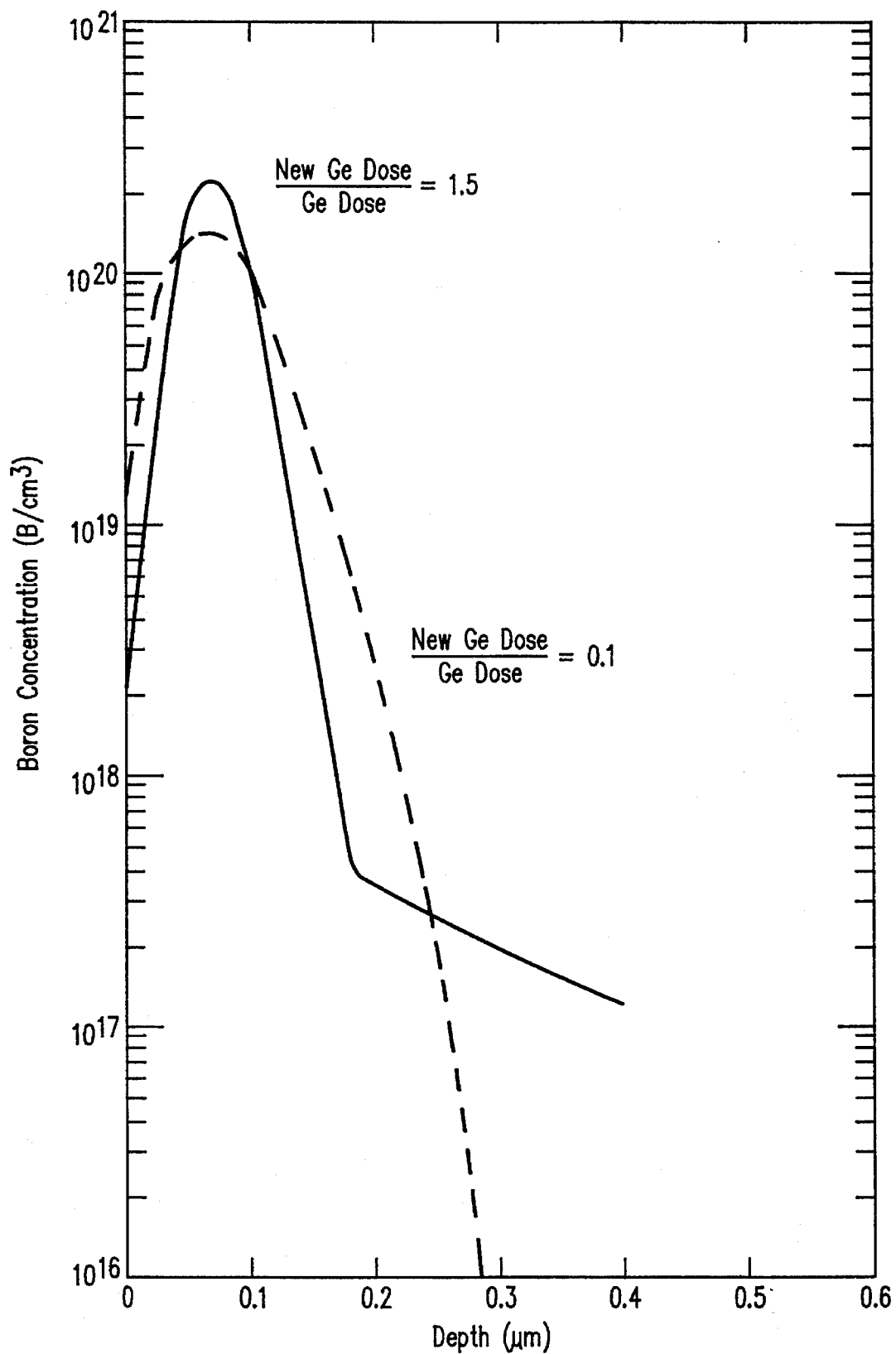
FIG. 6 is a graph illustrating the effect of boron diffusion behavior upon varying the germanium dose.

FIG. 6 shows the predictive power of the methodology. It shows the effect on boron diffusion behavior upon varying the germanium dose. Initial germanium and boron implant conditions are as described for FIG. 5. Simulated anneal conditions are as noted for FIG. 5. The result when the germanium dose is increased by 50% predicts increased retardation coupled with an enhanced tail. This is found experimentally. In the case of phosphorus, for example, a fit to experiment was obtained with $f_{P(Ge);u} \sim -1.2 \times 10^5$ eV/cm when the germanium dose was $1.5 \times 10^{16}$ Ge/cm². The flux expression is more complicated for boron (and other group III dopants) because of dual mode behavior predicted for diffusion in silicon.

IV. Two Dopant Systems: Both Dopants are Diffusing

In this case, the distribution of each dopant is changing over time. The diffusion of each dopant is being modified dynamically by the other dopant. The pair of dopants examined were boron and gallium in silicon. They belong to the same group (III) in the periodic table. Quantum chemical calculations on a model silicon lattice led to the conclusion that this pair of dopants would strongly interact; the predicted behavior was verified experimentally.

The diffusion coefficients for boron and gallium were determined for the isolated species. Since the one-dimensional diffusion code provided for diffusion only in silicon, it was found necessary to readjust the initial gallium dose to reflect the fact that the largest portion of the implanted gallium diffused out of the silicon at 1000° C. The dose level that matched simulation to experiment was $2.5 \times 10^{13}$ Ga/cm² rather than the experimental value of $1 \times 10^{14}$ Ga/cm². The fitting to the diffusion of isolated boron revealed, for all cases, that the implanted dose of boron had to be twice the nominal value ($3 \times 10^{14}$ B/cm²) that was requested for the experiments. Furthermore, in one case, the boron implant energy was 140 keV rather than the requested 40 keV. The boron information on the experiments have been changed to reflect the conclusions forced by simulation on the isolated boron implants. The experiment where boron was implanted at 140 keV was used to obtain the pair of force factors, $f_{B(Ga);u}$ and $f_{Ga(B);u}$. These were determined for only that one configuration and then used for all other calculations without change.

Figure 7:
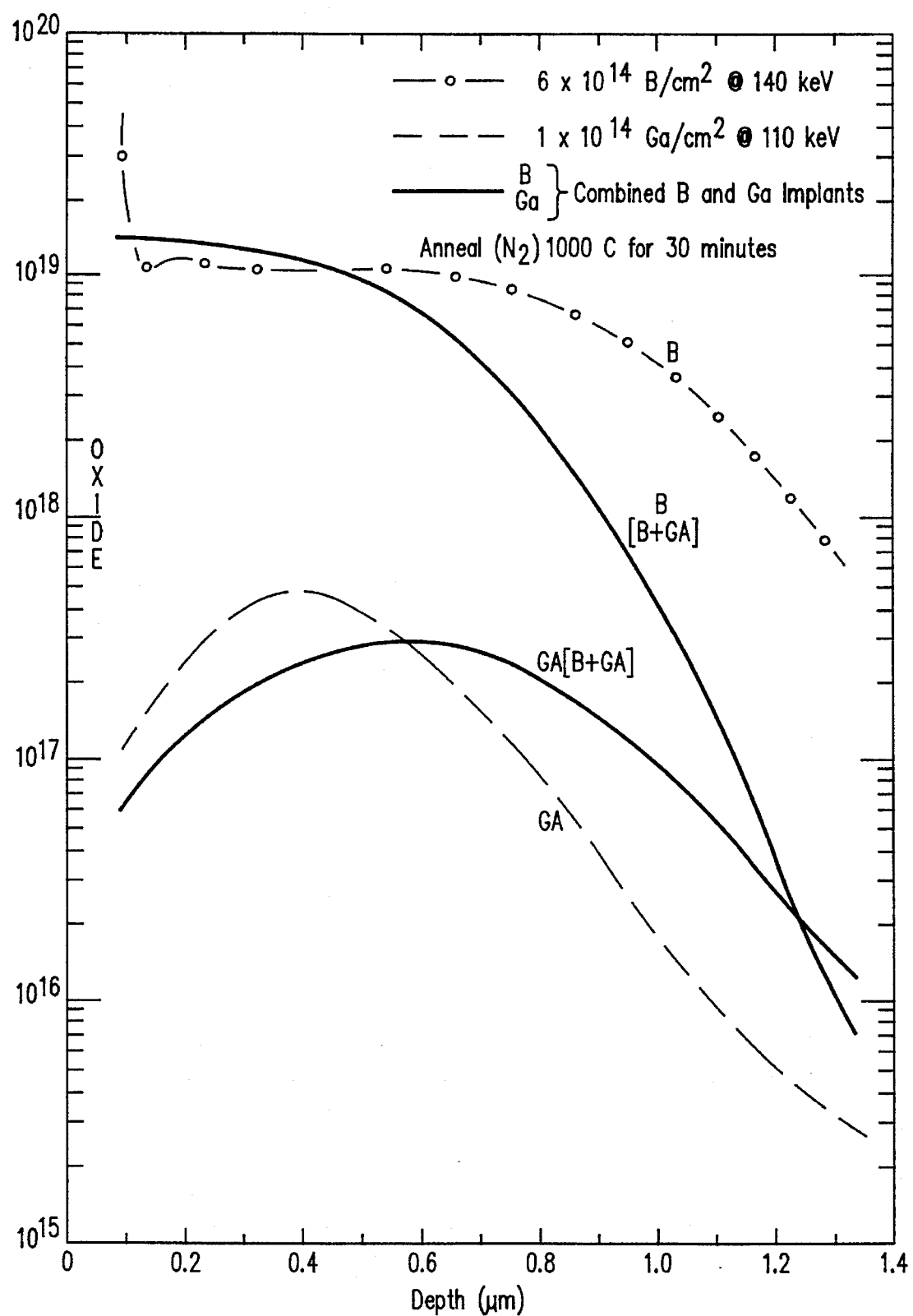
FIG. 7 is a graph illustrating SIMS chemical concentration profiles of boron and gallium either when isolated or implanted together and annealed under neutral ambient conditions.

FIG. 7 shows the set of experiments used to obtain diffusion coefficients for boron and gallium along with the pair of force constants used in simulating the coupled diffusion of boron and gallium. For the SIMS chemical concentration profiles, the boron dose was $6\times10^{14}$ B/cm$^2$ at 140 keV and gallium dose was $1\times10^{14}$ Ga/cm$^2$ at 110 keV, either when isolated or implanted together and annealed in all cases under neutral ambient (N$_2$) conditions at 1000° C. for 30 minutes.

Figure 8:
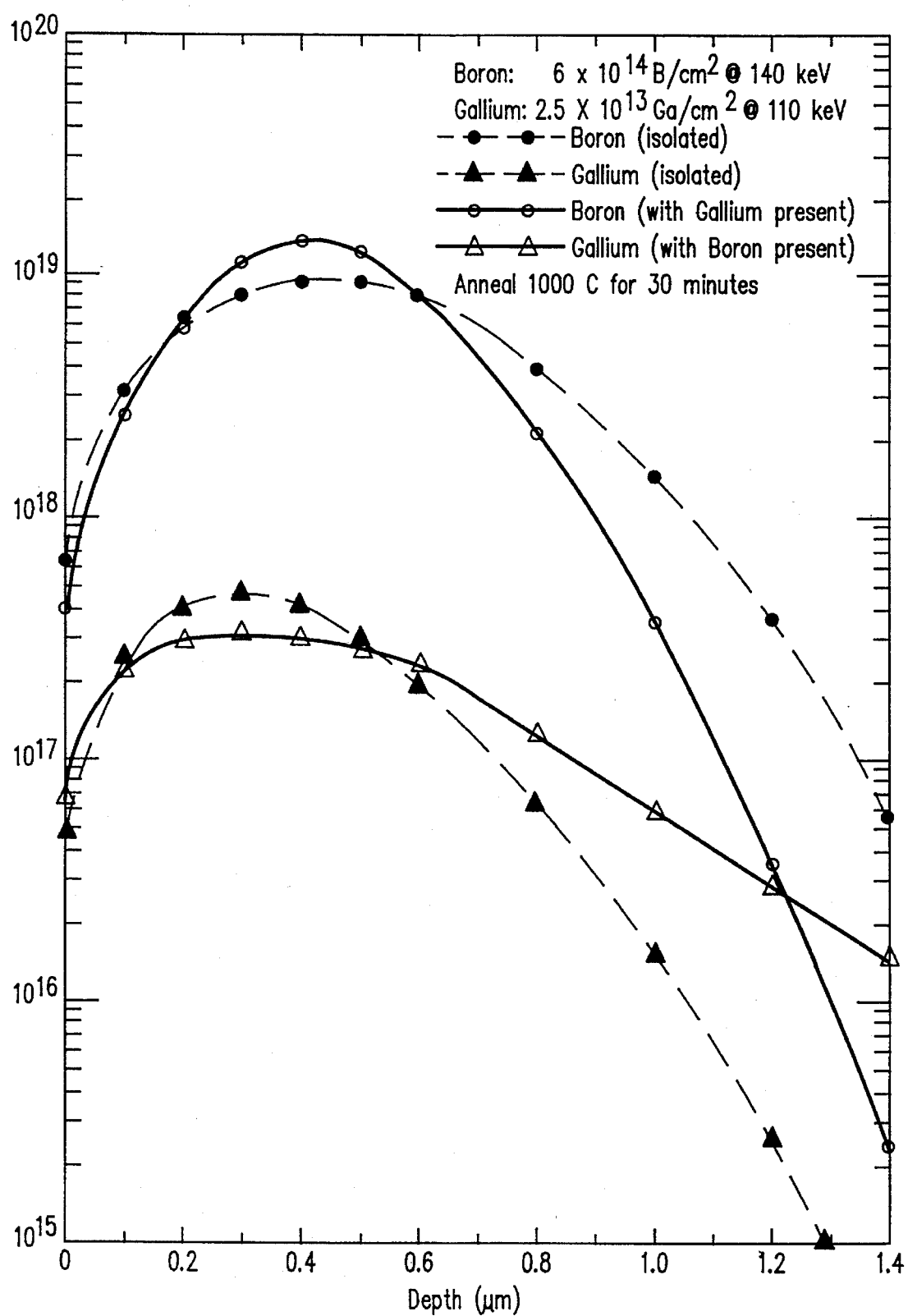
FIG. 8 is a graph illustrating simulated results for the boron and gallium experiments shown in FIG. 7.

FIG. 8 displays the simulation results with respect to FIG. 7. The values of the force factors, $$f_{B(Ga);u} \sim 1.0\times10^4 \text{ eV/cm},$$

$$f_{Ga(B);u} \sim -4.5\times10^4 \text{ eV/cm}.$$

Figure 9:
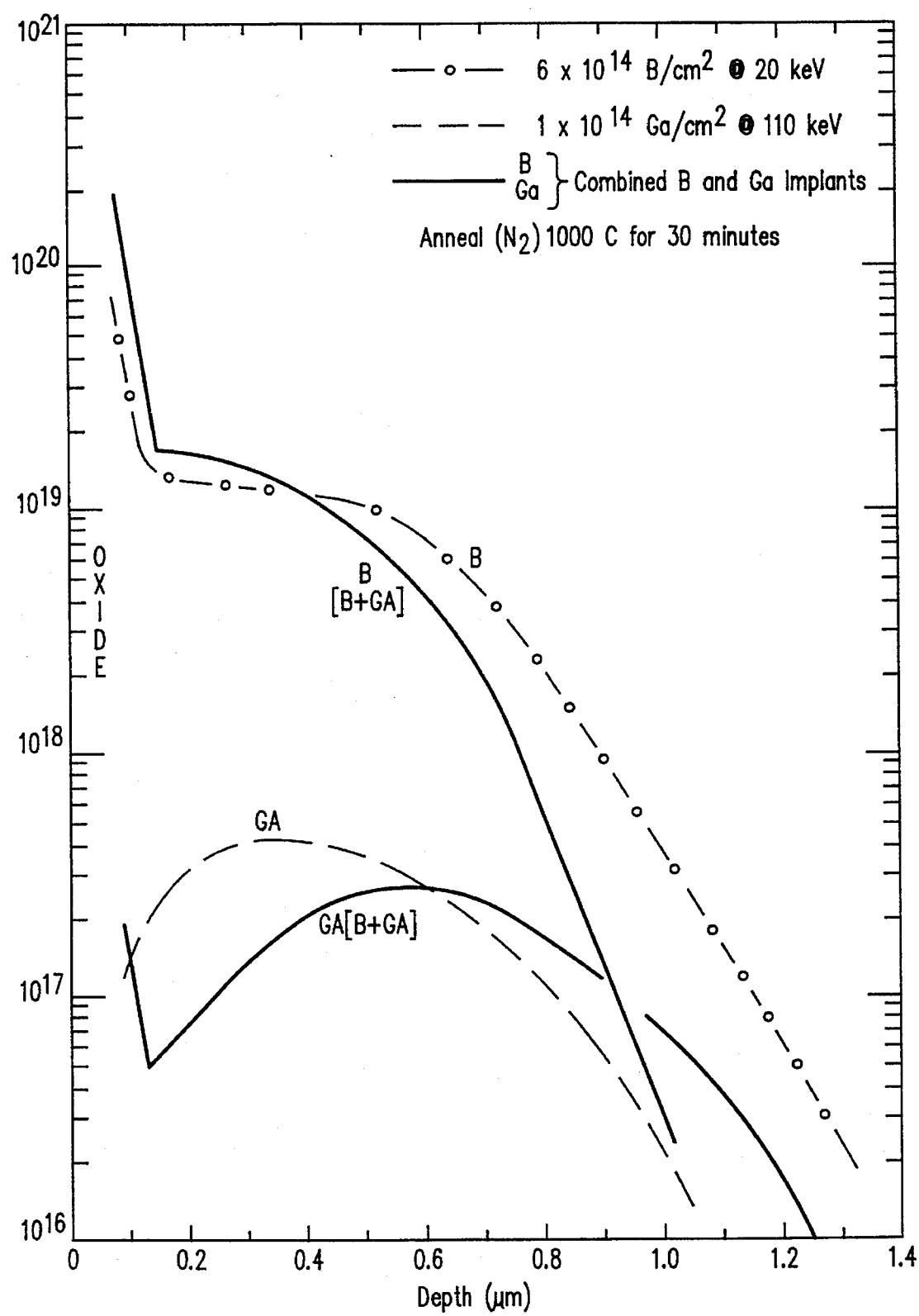
FIG. 9 is a graph illustrating SIMS chemical concentration profiles of boron and gallium either when isolated or implanted together and annealed under neutral ambient conditions.

FIG. 9 shows SIMS chemical concentration profiles of boron (implant dose was $6\times10^{14}$ B/cm$^2$ at 20 keV) and gallium (implant dose was $1\times10^{14}$ Ga/cm$^2$ at 110 keV) either when isolated or implanted together and annealed in all cases under neutral ambient (N$_2$) conditions at 1000° C. for 30 minutes.

Figure 10:
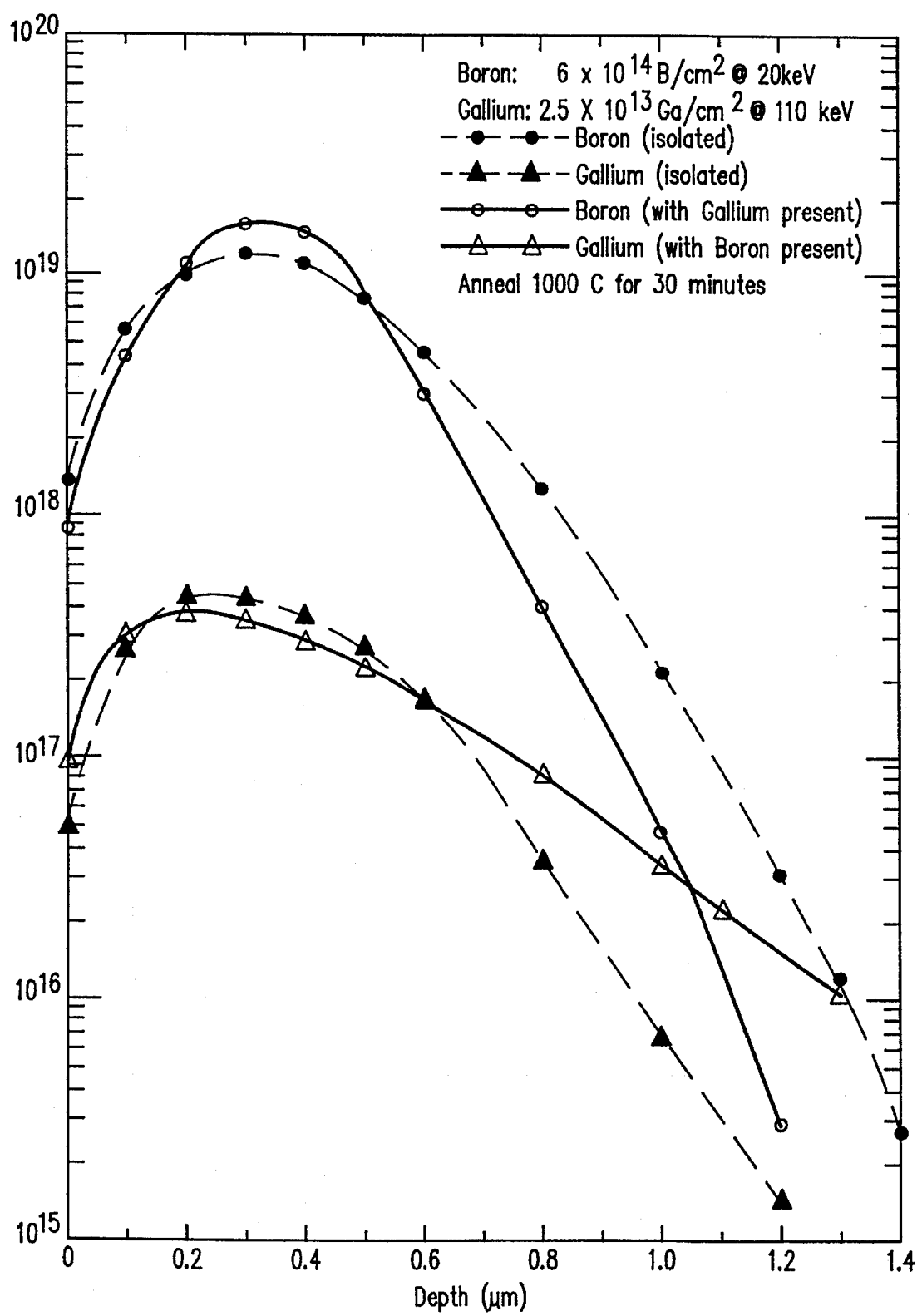
FIG. 10 is a graph illustrating simulated results for the boron and gallium experiments illustrated in FIG. 9.

FIG. 10 shows simulated results for the boron and gallium experiments shown in FIG. 9. All parameters were the same as those set forth with respect to FIG. 8. Note that the gallium implant was reduced in the simulations in FIG. 8 in order to compensate for outdiffusion of the gallium (which was not provided for in the simulation program).

V. A Note on Dopant Distributions

The distribution function at a point (x,y,z) and time t for a dopant can be expressed as the ratio of the total integrated concentration of that dopant at time t and its concentration at point (x,y,z). That is, the value of the distribution function of dopant A at (x,y,z) and time t $$g_A(x,y,z,t) = C_A(x,y,z,t) / \int du \int dv \int dw \, c_A(u,v,w,t). \tag{9}$$

The net integrated difference in the distribution with respect to y, for example, equals $$\int du \int dw \left\{ \int_{-\infty}^{y} g_A dv - \int_{y}^{\infty} g_A dv \right\} =$$

$$\int du \int dw \left\{ \int_{-\infty}^{y} C_A dv - \int_{y}^{\infty} C_A dv \right\} / \int du \int dv \int dw C_A.$$

The integrals may be discretized and evaluated by standard numerical methods.

VI. General Conclusion

The above-described methodology is based on two assertions derived from quantum chemical calculations: (1) Dopant species, in regions of the host semiconductor where there are overlapping populations of those species, will display diffusion patterns moderated by dopant-dopant interactions and (2) these interactions are transmitted by the host molecular orbitals; the transmission occurs with very little diminution. As a consequence, the diffusion of a dopant species will be moderated at each position by the appropriate net integrated differences in the components of the distribution of all other dopant species present in the relevant region.

A full three-dimensional macroscopic methodology then was derived.

It was shown that when distributions were uniform in some of the directions, reduction in the dimensionality of the effective force experienced by a dopant resulted.

Applications were made to two types of dopant systems The first type simulated the case where the distribution of one dopant was fixed. Agreement with experimental results was very good. The second type examined the more complex situation where two dopants were diffusing. In this situation, both distributions changed with time. The methodology developed above was found to be completely capable of dealing with this case.

The methodology described above provides a robust approach to simulating dopant diffusion moderated by dopant-dopant interactions. It offers, to date, the only method capable of quantitatively dealing with the effects of dopant-dopant interactions on diffusion.

VII. Modeling Boron and Phosphorous Diffusion in Germanium Rich Regions of Silicon In a recent study, using quantum chemical calculations for guidance, electrically active dopant diffusion in silicon was predicted to be and found to be dramatically altered in germanium rich regions. S. Aronowitz, "Dopant Diffusion Control in Silicon Using Germanium", Journal of Applied Physics Vol. 68, No. 7, Oct. 1, 1990, p. 3293.

The aspect that proved elusive to understand was the powerful predictive capability of calculations on a very restricted model silicon cluster (less than 1.5 nm across). This predictive power had been established previously, but not in so an unambiguous fashion.

The predictive power of the calculations was emphasized because of the conventional view that germanium, as a close cousin to silicon, would not perturb the lattice environment to any noticeable degree. There was no anticipation that theory would indicate that, when fully incorporated into the silicon lattice in substitutional sites, germanium would interact strongly with electrically active dopants.

The conceptual difficulty arises from the very success of the theoretical predictions; results on a scale of one to two nanometers that apply equally well to dimensions of hundreds of nanometers suggest that the means of transmission of forces should be examined.

As stated above, the one mechanism that permits interactions between germanium, at substitutional sites, and other dopants, to span very large distances with little diminution involves the molecular orbitals of the silicon lattice. Transmission with minimal diminution of forces can be translated into a macroscopic approach.

The germanium-in-silicon interaction with other impurity species is a relatively simple system to study. First, experiments, performed with germanium fully incorporated into the silicon lattice, were executed at a sufficiently low anneal temperature (900° C.) that the germanium distribution can be treated as fixed. Second, germanium is not electrically active in silicon; consequently, the blanket invocation of electric field modification of diffusion behavior cannot be made.

The following discussion begins the formulation of a new approach for analyzing dopant diffusion in silicon in the presence of other dopant species.

VIII. General First-Order Formulation of Germanium-Active Dopant Interaction in Silicon The effects of unanticipated electronic interactions between germanium occupying substitutional sites in silicon and other dopant species, from calculations involving an atomically minuscule model lattice but verified experimentally over dimensions spanning hundreds to thousands of lattice spacings, can be understood if the interaction forces were essentially undiminished over very large distances. In turn, the medium readily available to transmit interactions over macroscopic portions of the lattice with minimal attenuation are the molecular orbitals of the crystal; on the other hand, disturbances transmitted through space, such as coulombic interactions, are shielded and effectively confined.

The effect on the flux density of a dopant species will be treated as an additional force component. As such, these flux terms can be conveniently cast in the form:

$$D_i C_i f_i / kT.$$

$D_i$ is the diffusion coefficient of the ith dopant species; $C_i$ is the concentration, at time t, of that species at a point (x,y,z). All interactions with germanium are contained in the effective force $f_i(x,y,z)$. This factor at (x,y,z) represents the net effective force generated by all the germanium on dopant at (x,y,z). Assumed uniformity in the z-direction results in net cancellation of the z component of the effective force on dopant i at (x,y,z). If the germanium distribution, $h_{Ge}(x,y)$, in the (x,y) plane is not uniform and x represents the depth in silicon (ranging from 0 to ∞) while y represents the length (ranging from −∞ to ∞), then the force $f_i$ will be set equal to $$\vec{f}_i(x,y) \approx \quad (10)$$

$$\alpha_{i,Ge}\left(\left\{\int_{-\infty}^{\infty}\left[\int_0^x h_{Ge}(u,v)du - \int_x^\infty h_{Ge}(u,v)du\right]\right\}\vec{a} + \left\{\int_0^\infty du\left[\int_{-\infty}^y h_{Ge}(u,v)dv - \int_y^\infty h_{Ge}(u,v)dv\right]\right\}\vec{b}\right).$$

The $\alpha_{i,Ge}$ is a suitable effective force factor. The germanium distribution satisfies the condition that $$\int_0^\infty \int_{-\infty}^\infty h_{Ge}(u,v)dv\,du = 1. \quad (11)$$

Equation (10) is the mathematical expression of the fundamental assertion that a dopant experience net interaction with germanium transmitted, undiminished, from all portions of a germanium rich region. Equation (11) ensures completeness of the germanium contribution. The factoring of the force factor from the distribution function is an approximation adopted for reasons of tractability.

Uniformity of the germanium distribution in the y-direction will be assumed for purposes of this paper. The reduced force $f_i(x)$ equals $$f_i(x,y) \approx \alpha_{i,Ge}\left\{\int_0^x g_{Ge}(u)du - \int_x^\infty g_{Ge}(u)du\right\}, \quad (12)$$

$$\int_0^\infty g_{Ge}(u)du = 1.$$

IX. Interaction Between Germanium At Substitutional Sites In Silicon and Arsenic and Phosphorus Quantum chemical calculations delineating interactions between substitutional germanium and the n-type dopants from group V, arsenic and phosphorus, yielded that only attractive forces arose irrespective of whether the group V species occupied interstitial or substitutional positions. Moreover, experimentally phosphorus displayed sharply diminished diffusion in germanium rich regions of silicon when compared to the behavior in germanium-free regions of the same silicon crystal. In agreement with theory, the diffusion of both interstitial and substitutional phosphorus was retarded. The expression for the phosphorus diffusion flux contains the additional term, $$-\frac{1}{kT} D_P(x) C_P(x,t) \left\{ \alpha_{P,Ge}\left[\int_0^x g_{Ge}(u)du - \int_x^\infty g_{Ge}(u)du\right]\right\},$$

$\alpha_{P,Ge}$ represents an averaged macroscopic force $$\alpha_{P,Ge} = \left(-\frac{\partial E_{Ge,P}(\text{silicon})}{\partial x}\right).$$

This force factor $$\alpha_{P,Ge} < 0$$

because the force is attractive whether the group V dopant is interstitial or substitutional. Moreover, the magnitudes of the forces, estimated from the model calculations, are approximately the same for either arsenic or phosphorus. Consequently, the contribution to the phosphorus flux density equals $$J_P = \quad (13)$$

$$-\frac{1}{kT} D_P |\alpha_{P,Ge}| C_P(x,t) \left\{\int_x^\infty g_{Ge}(u)du - \int_0^x g_{Ge}(u)du\right\}.$$

The contributions to the continuity equation because of the additional flux component are given by $$-\frac{\partial J_P}{\partial x} = \quad (14)$$

$$\frac{1}{kT} D_P |\alpha_{P,Ge}| \left[\frac{\partial C_P(x,t)}{\partial x}\left\{\int_x^\infty g_{Ge}(u)du - \int_0^x g_{Ge}(u)du\right\} + C_P(x,t)\frac{\partial}{\partial x}\left\{\int_x^\infty g_{Ge}(u)du - \int_0^x g_{Ge}(u)du\right\}\right].$$

The complete one-dimensional expression of Fick's second law for phosphorus diffusion equals $$\frac{\partial C_P(x,t)}{\partial t} = \frac{\partial}{\partial x} D_P \frac{\partial}{\partial x} C_P(x,t) - \frac{\partial J_P}{\partial x}. \quad (15)$$

X. Interaction Between Substitutional Germanium and Group III Dopants

Quantum chemical calculations examined three members of group III: aluminum, boron, and gallium. The predicted behavior in germanium rich regions in silicon for group III dopants differed from that predicted, and observed, for group V. When substitutional, the force between a group III species and a substitutional germanium was repulsive while when the group III element was interstitial, the force between it and the germanium was attractive. As a consequence, diffusion would be enhanced when the group III dopant was substitutional but diffusion would be retarded when the species was interstitial in regions of crystalline silicon having high concentrations of germanium. This behavior pattern was verified experimentally.

Boron will be used as the representative group III element. As a consequence of the intimate dependency of the diffusion behavior on the nature of the site boron occupies, the additional flux term will have two distinct components. One component is a function of the concentration of substitutional boron in the vicinity of x while the other component is a function of the concentration of interstitial boron in the same vicinity of x. The concentration of substitutional boron in the vicinity of x can be formally written as $$C_{B(s)}(x,t) = \sigma(x,t) C_B(x,t).$$

In turn, the concentration of interstitial boron in the vicinity of x equals $$C_{B(i)}(x,t) = [1 - \sigma(x,t)] C_B(x,t).$$

The flux term $$J_B = \qquad (16)$$

$$\left[ -\frac{1}{kT} D_B |\alpha_{B,Ge}|(1-\sigma) C_B(x,t) + \right.$$

$$\left. \frac{1}{kT} D_B |\beta_{B,Ge}| \sigma C_B(x,t) \right] \left\{ \int_x^\infty g_{Ge}(u) du - \int_0^x g_{Ge}(u) du \right\}.$$

The simplifying assumption is made that the magnitude of the force factor when boron is interstitial, $|\alpha_{B,Ge}|$, is equal to the magnitude of the force factor, $\beta_{B,Ge}$, when the boron is substitutional. Estimates derive from model calculations yield that the assumption, but it is not rigorous. With the magnitudes $$|\alpha_{B,Ge}| = |\beta_{B,Ge}|,$$

the expression in eq. (7) reduces to $$J_B = -\frac{1}{kT} D_B |\alpha_{B,Ge}| [1 - 2\sigma(x,t)] C_B(x,t) \qquad (17)$$

$$\left\{ \int_x^\infty g_{Ge}(u) du - \int_0^x g_{Ge}(u) du \right\}.$$

XI. Modeling Results

A one-dimensional diffusion program was written to test the concepts discussed above. The implicit method was used to generate the system of equations from discretization of equation (15) and Gaussian elimination was used to solve that system of equations. Germanium profiles were created from the analytic expression $$C_{Ge}(u) = DOSE \cdot g_{Ge}(u),$$

$$g_{Ge}(u) = \frac{1}{2} [\omega \cdot \exp(-\omega u) + 2\omega u \cdot \exp(-\phi u^2)];$$

$$\omega = 3.4 \times 10^5, \phi = 5.0 \times 10^9.$$

DOSE is the germanium implant dose. The distribution function $g_{Ge}(u)$ is artificial and was used as a convenient and simple means of generating germanium profiles. It is normalized, $$\int_0^\infty g_{Ge}(u) du = 1.$$

Figure 11:
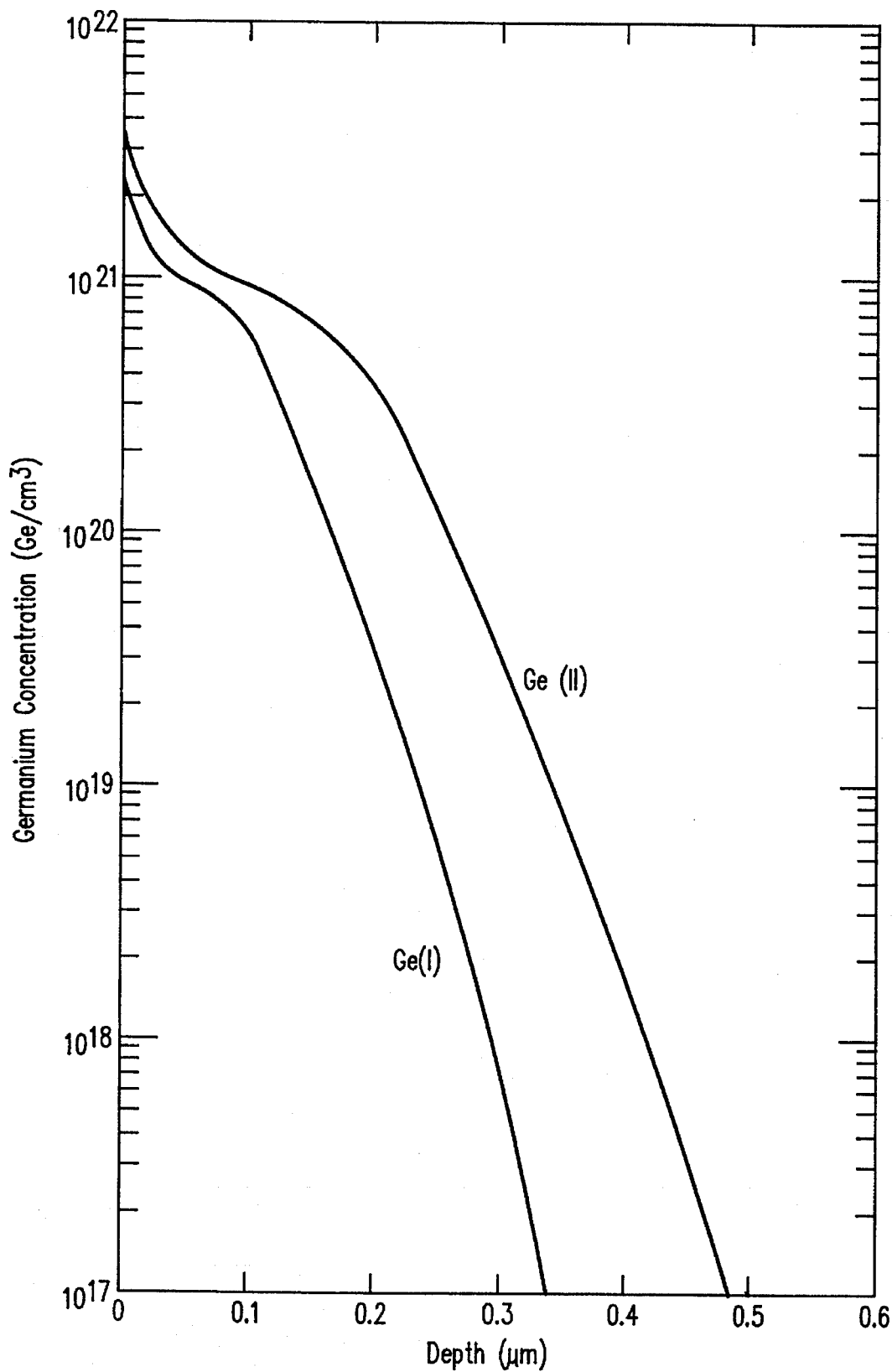
FIG. 11 is a graph illustrating artificially generated germanium concentration profiles.

The dose was set equal to $1.5 \times 10^{16}$ Ge/cm$^2$ when phosphorus was examined; it was set slightly higher for the boron study ($2.5 \times 10^{16}$ Ge/cm$^2$). These values mirror the level of doses used experimentally. The appropriate germanium curves are displayed in FIG. 11.

A simple Arrhenius form for both phosphorus and boron diffusion coefficients was adopted:

$$D_P = A_P \exp(-\epsilon_P / kT),$$

$$D_B = A_B \exp(-\epsilon_B / kT).$$

They were adjusted to yield, approximately, the experimental boron and phosphorus profiles when germanium was not present. The values for $\alpha_{P,Ge}$ and $\alpha_{B,Ge}$ were then determined. They equal, respectively, $$\alpha_{P,Ge} \approx -1.2 \times 10^5 \text{ eV/cm},$$

$$\alpha_{B,Ge} \approx -1.0 \times 10^5 \text{ eV/cm}.$$

An additional assignment for boron set $$\sigma = 0, C_B > 5.0 \times 10^{16} \text{ B/cm}^3;$$

$$\sigma = 1, C_B < 5.0 \times 10^{16} \text{ B/cm}^3.$$

Germanium distributions were generally cut-off for concentrations below $10^{14}$/cm$^3$.

Figure 12:
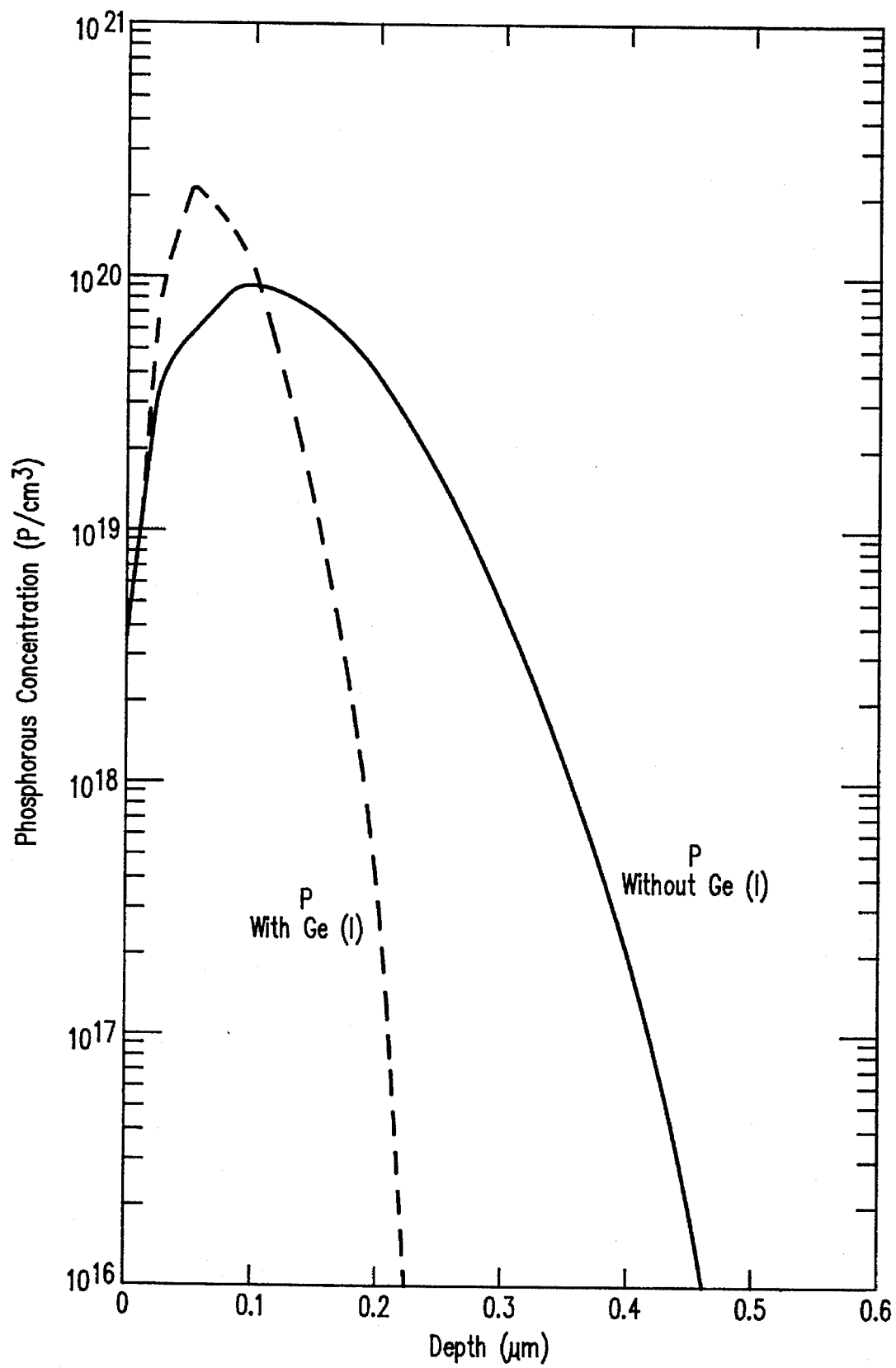
FIG. 12 is a graph illustrating simulated profiles of the diffusion of phosphorous in the presence or absence of germanium.

The simulated phosphorus profiles are shown in FIG. 12. The phosphorous dose equalled $1.5 \times 10^{15}$ P/cm$^2$; the implant energy was 30 keV. The simulated anneal conditions were 900° C. for 30 minutes under a neutral ambient. Variation of effects with dose were explored since the interaction forces are directly proportional to the dose in our first-order treatment. When the dose was increased by 50%, the phosphorus diffusion was retarded to an even greater degree. More interesting was that when the germanium dose was reduced to $1.5 \times 10^{15}$ Ge/cm$^2$ (10% of its initial value), the retardation of phosphorus became a very subtle effect. That is, under normal processing variations, the effect could easily be masked by other factors. This dose is nominally the magnitude of dose used to pre- or post-amorphize silicon. Only in sufficiently high concentrations would additional effects due to the presence of germanium be readily discernible.

Figure 13:
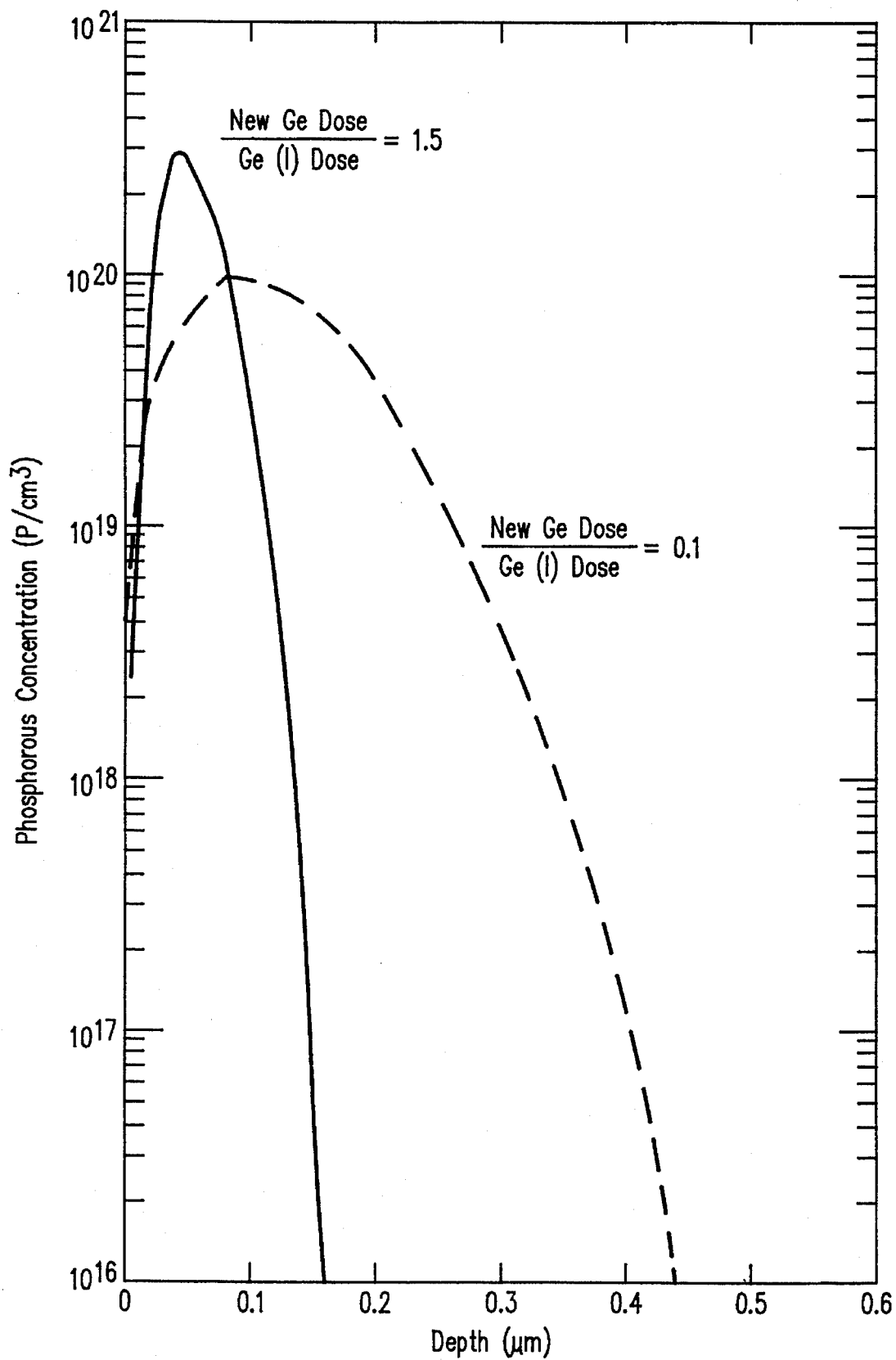
FIG. 13 is a graph illustrating simulation results of the effects on phosphorous diffusion when the germanium dose is varied.

The results of varying germanium dose on phosphorus diffusion are displayed in FIG. 13. The conditions for the phosphorous diffusion are as stated above with respect to FIG. 12.

Figure 14:
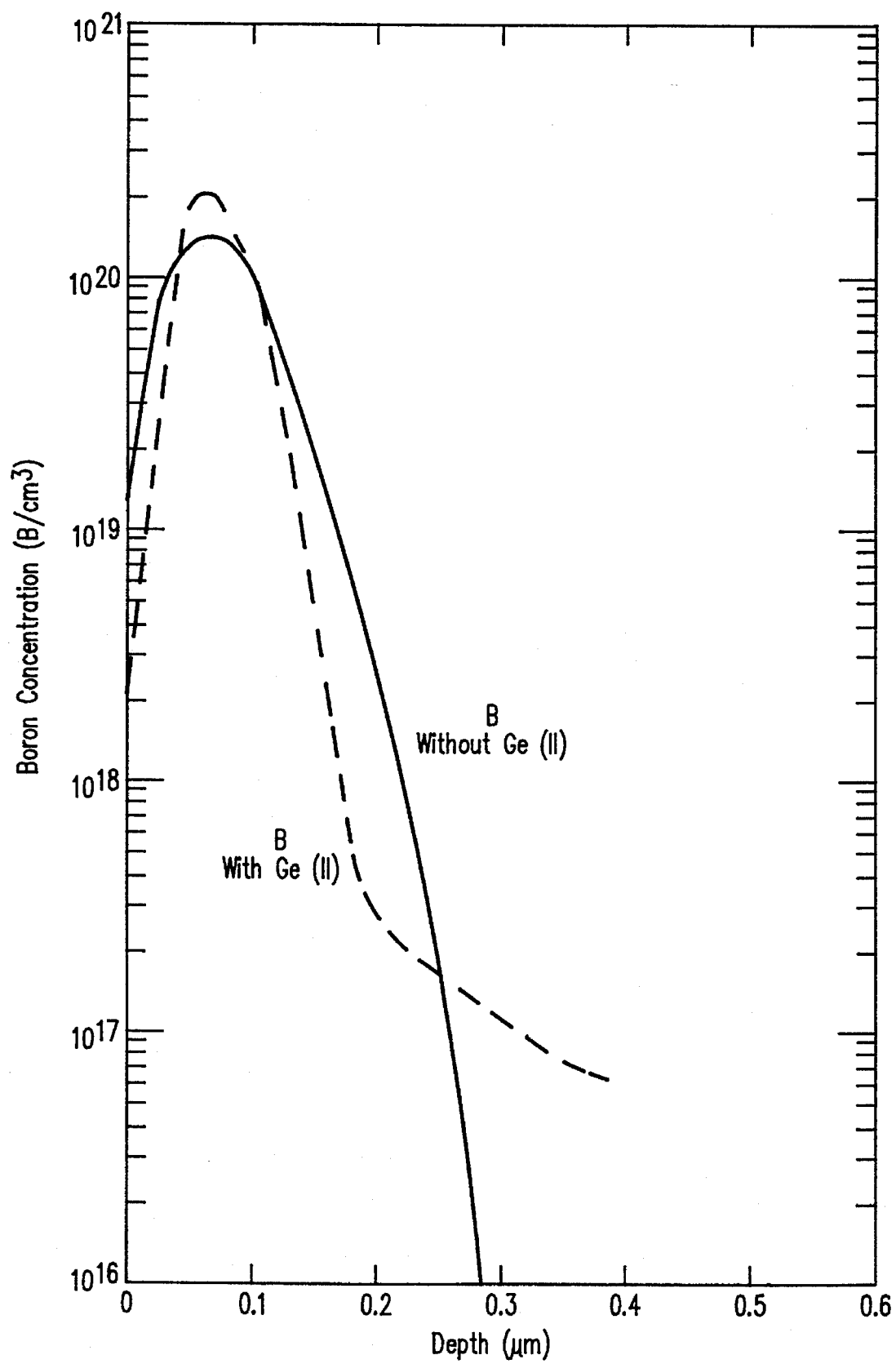
FIG. 14 is a graph illustrating simulated profiles of the diffusion of boron annealed under neutral ambient conditions when germanium is present or absent.
Figure 15:
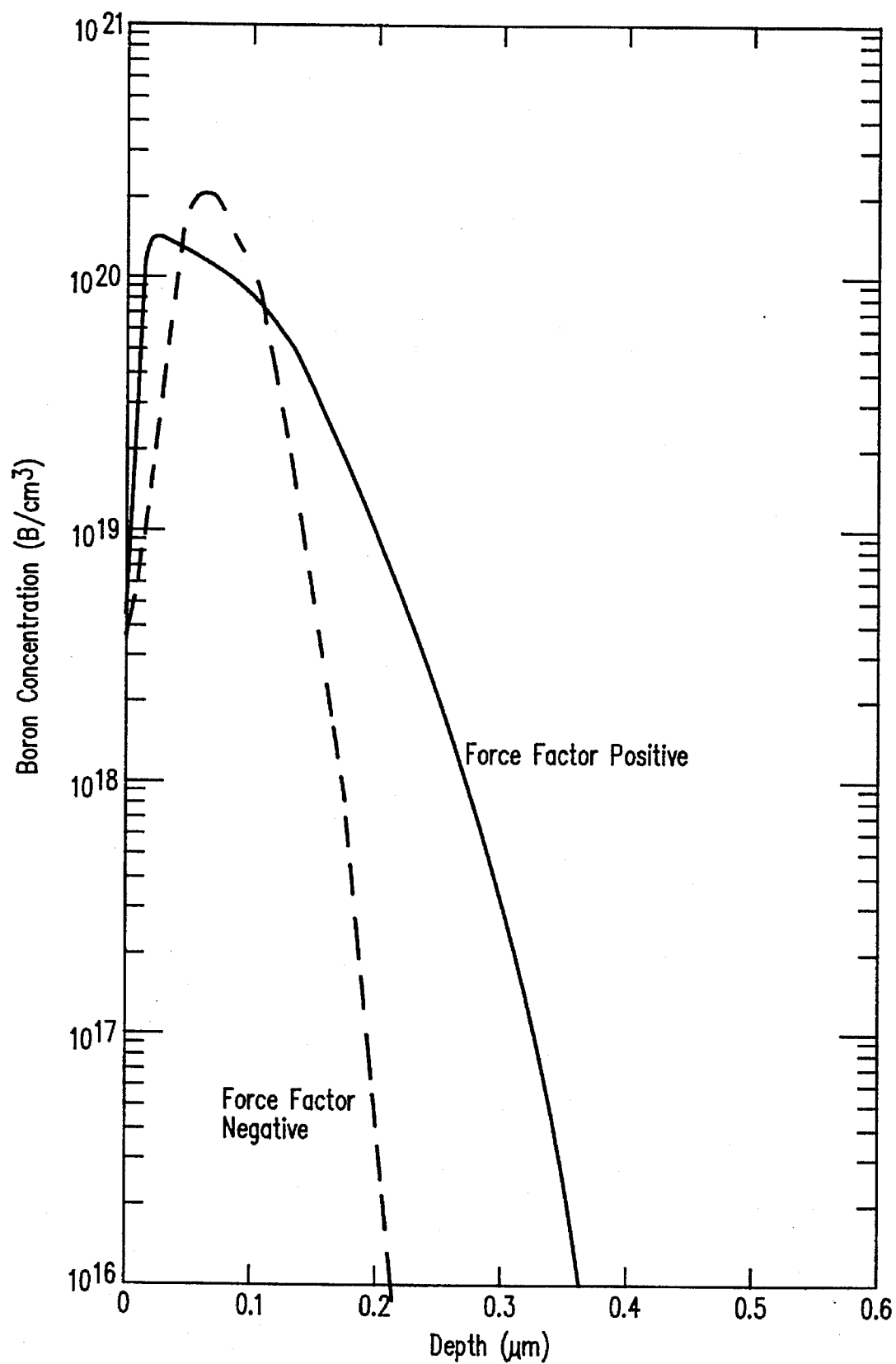
FIG. 15 is a graph illustrating the effect on boron diffusion, shown in FIG. 14, when it is stipulated that the interactive force is completely attractive or completely repulsive.
Figure 16:
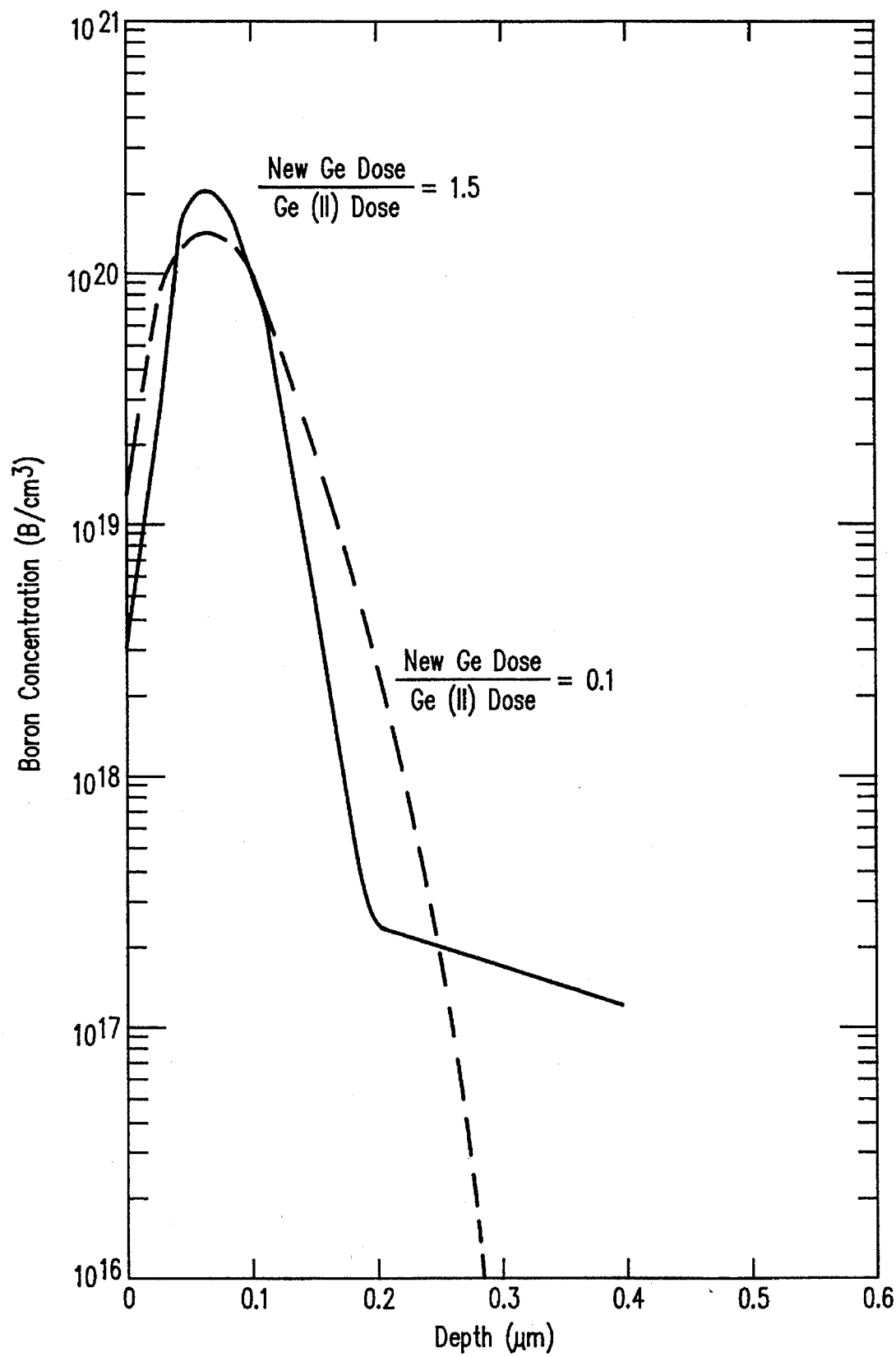
FIG. 16 is a graph illustrating the effects of varying the germanium dose on boron diffusion.

The simulated boron profiles are shown in FIG. 14. The conditions are: $1.5 \times 10^{15}$ B/cm$^2$ at 9 keV and annealed at 900° C. for 30 minutes under neutral ambient conditions. Suppression of the dual nature of group III interaction with substitutional germanium yields results at total variance with experiment; those simulations are presented in FIG. 15. FIG. 15 shows the effect on boron diffusion shown in FIG. 14, when it is stipulated that the interactive force between boron and germanium is either completely attractive or wholly repulsive. Finally, as was done for the phosphorus case, the germanium dose was first increased by 50% above its initial value, then it was reduced to 10% ($2.5 \times 10^{15}$ Ge/cm$^2$) of that initial value. A 50% increase in dose causes both additional retardation of diffusion and also leads to enhancement in the tail concentration when comparison is made between the profile in FIG. 14 and that in FIG. 16, which shows simulation results on the effects of varying the germanium dose on boron diffusion. The conditions for the boron diffusion are as set forth above with respect to FIG. 14. This result is in complete accord with experiment. Reducing the dose by an order of magnitude essentially eliminates discernible effects arising solely from interaction with germanium.

XII. Discussion and Conclusion

Extension of current models of single dopant diffusion invoke a host of ameliorating couplings with vacancies or interstitials or both to produce varying degrees of suitable explanations of experimental results. Even single dopant modeling, using standard approaches, presents a maze of conflicting interpretations as well as extensive sets of coupling arrangements. The difficulty resides in that the explanations are made after the fact and are done as each new experiment produces results that were not anticipated.

Theories possessing limited predictive power that must be continually rationalized after the fact are inadequate. The current diffusion theories that couple active dopant with interstitial and vacancies are inadequate to deal with dopant-dopant interactions. On the other hand, application of quantum chemical approaches have displayed extensive predictive power. The above disclosure has attempted to introduce the connection to a macroscopic description of dopant diffusion in silicon moderated by interaction with other dopant species that are present.

The connection between the atomic level behavior and the macroscopic level is made through the medium of transmission of interactions between dopant species. It is stipulated, from examination of the results of quantum chemical calculations, that the medium is the set of molecular orbitals of the host lattice. Consequently, interactions can be transmitted over very large separations with minimal diminution in magnitude. In the proposed methodology, additional flux terms arise because of the interaction between dopant species. The germanium-active dopant system was studied because of the unique properties associated with that system:

(1) Interaction between a group III or group V dopant was predicted to be intense with germanium in substitutional sites in silicon at high concentrations. This was verified experimentally.
(2) To first-order, movement of germanium could be ignored because of the low anneal temperature used when a second species was introduced.
(3) Germanium, as a member of the same group as silicon, is electrically inactive in silicon; therefore, macroscopic electric field terms in the diffusion equation are not significant.
(4) Predicted behavior for group III species differs sharply from predicted behavior for group V species. Both patterns have been verified experimentally.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method of fabricating a semiconductor device having a desired distribution of dopant species within a semiconductor material, the method comprising:

(a) selecting a plurality of dopant species to be distributed within the semiconductor material;
(b) representing a force experienced by a first dopant species of a pair of the plurality of dopant species at a given point in the semiconductor material at a given time due to its interactions with a second dopant species of the pair of dopant species by a force term, wherein the force term is substantially equal to the product of a dopant-dopant interaction force factor and the difference between the amount of the second dopant species extending in one direction from the given point and the amount of the second dopant species extending in an opposite direction from the given point;
(c) selecting a set of process parameters to be used in modeling the fabrication of the semiconductor device, wherein the set of process parameters are representative of those specified during the fabrication of the semiconductor device;
(d) generating a diffusion equation of the form $$\frac{\partial C}{\partial t} = \nabla \cdot (D \nabla C) - \nabla \cdot J,$$

where $\partial$ is a partial derivative of the indicated variable, C is the distribution profile of one of the dopant species in the pair of dopant species, D is a diffusion coefficient of the dopant species having a distribution profile C, $\nabla C$ is a gradient of C, $\nabla \cdot$ is an operator representing a divergence of the indicated variable, and J is a flux density term which is proportional to the force term described in (b);
(e) solving the diffusion equation formed in (d), thereby determining an expected distribution profile for one of the plurality of dopant species;
(f) repeating steps (b) through (e) of the method until the expected distribution for said one of the plurality of dopant species is approximately equal to the desired distribution of that dopant species; and
(g) fabricating the semiconductor device based on the process parameters which produced the expected distribution which is approximately equal to the desired distribution of that dopant species.

2. The method of claim 1, wherein the flux density term J and the force term are related by $J=DCF/kT$, where F is the force term, k is Boltzmann's constant, and T is the absolute temperature of the semiconductor material and is one of the set of process parameters used in modeling the fabrication of the semiconductor device.

3. A method of fabricating a semiconductor device having a desired distribution of dopant species within a semiconductor material, the method comprising:

(a) selecting a plurality of dopant species to be distributed within the semiconductor material;
(b) selecting an initial implant dose for each of the dopant species;
(c) implanting the selected initial dose for each of the dopant species into the semiconductor material;
(d) processing the semiconductor material to produce a processed semiconductor material;
(e) measuring an actual distribution profile of each of the implanted dopant species within the processed semiconductor material;
(f) selecting a value of a dopant-dopant interaction force factor for each possible pair-wise combination of the selected dopant species, the force factor value being dependent on the distributions of the dopant species measured in (e), wherein when the selected value is used to generate a force term representing a force experienced by a first dopant species of each pair-wise combination of the plurality of dopant species at a given point in the semiconductor material at a given time as a result of its interactions with a second dopant species of each pair-wise combination of dopant species, the force term being proportional to the product of the selected force factor value and the difference between the amount of the second dopant species extending in one direction from the given point and the amount of the second dopant species extending in an opposite direction from the given point, the force term being used to generate a diffusion equation of the form $$\frac{\partial C}{\partial t} = \nabla \cdot (D \nabla C) - \nabla \cdot J,$$

where $\partial$ is a partial derivative of the indicated variable, C is the distribution profile of one of the dopant species in the pair of dopant species, D is a diffusion coefficient of the dopant species having a distribution profile C, $\nabla$ C is a gradient of C, $\nabla \cdot$ is an operator representing a divergence of the indicated variable, and J is a flux density term which is proportional to the force term, the use of the selected value results in a distribution profile of the dopant species which is approximately equal to the distribution profile measured in (e);

(g) selecting a new implant dose for each of the dopant species;

(h) generating a new dopant-dopant interaction force factor value corresponding to each of the new implant doses for each dopant species, wherein the new force factor value for a dopant species is obtained by scaling the previously selected force factor for that species in proportion to the new implant dose for that species;

(i) forming a force term for each pair-wise combination of dopant species according to the definition of a force term given in (f) and the new force factor values determined in (h), wherein the force terms are used to generate a plurality of diffusion equations according to the definition of a diffusion equation given in (f), with one such diffusion equation being generated for each pair-wise combination of dopant species;

(j) selecting a set of process parameters to be used in modeling the fabrication of the semiconductor device, wherein the set of process parameters are representative of those specified during the fabrication of the semiconductor device;

(k) solving the diffusion equations formed in (i), thereby determining an expected distribution of each of the plurality of dopant species;

(l) repeating steps (g) through (k) of the method until the expected distribution of dopant species is approximately equal to the desired distribution of dopant species; and (m) fabricating the semiconductor device based on the implant doses and process parameters which produced the expected distribution which is approximately equal to the desired distribution of the dopant species.

4. The method of claim 3, wherein the flux density term J and the force term are related by $J=DCF/kT$, where F is the force term, k is Boltzmann's constant, and T is the absolute temperature of the semiconductor material and is one of the set of process parameters used in modeling the fabrication of the semiconductor device.

5. A method of fabricating a semiconductor device having a desired distribution of dopant species within a semiconductor material, the method comprising:

(a) selecting a plurality of dopant species to be distributed within the semiconductor material;

(b) representing the total force experienced by a first dopant species of each pair-wise combination of dopant species at a given point in the semiconductor material at a given time as a result of its interactions with a second dopant species of that pair-wise combination of dopant species by a total force term having a component along each of three mutually perpendicular axes, wherein each component of the total force term is substantially equal to the product of a dopant-dopant interaction force factor and the difference between the amount of the second dopant species in the pair-wise combination of dopant species in one direction along the axis corresponding to that component of the total force term from the projection of the given point on that axis and the amount of the second dopant species in an opposite direction along that axis from the projection of the given point along that axis;

(c) generating a diffusion equation of the form $$\frac{\partial C}{\partial t} = \nabla \cdot (D \nabla C) - \nabla \cdot J,$$

where $\partial$ is a partial derivative of the indicated variable, C is the distribution profile of one of the dopant species in the pair of dopant species, D is a diffusion coefficient of the dopant species having a distribution profile C, $\nabla$ C is a gradient of C, $\nabla \cdot$ is an operator representing a divergence of the indicated variable, and J is a flux density term which is proportional to the total force term described in (b);

(d) selecting a set of process parameters to be used in modeling the fabrication of the semiconductor device, wherein the set of process parameters are representative of those specified during the fabrication of the semiconductor device;

(e) solving the diffusion equation formed in (c), thereby determining an expected distribution profile for each of the dopant species in the pair-wise combination of dopant species;

(f) repeating steps (b) through (e) of the method until the expected distribution of the dopant species is approximately equal to the desired distribution of dopant species; and (g) fabricating the semiconductor device based on the process parameters which produced the expected distribution of the dopant species which is approximately equal to the desired distribution of the dopant species.

6. The method of claim 5, wherein the flux density term J and the force term are related by $J=DCF/kT$, where F is the force term, k is Boltzmann's constant, and T is the absolute temperature of the semiconductor material and is one of the set of process parameters used in modeling the fabrication of the semiconductor device.

7. A method of fabricating a semiconductor device having a desired distribution of dopant species within a semiconductor material, the method comprising:

17

(a) selecting a plurality of dopant species to be distributed within the semiconductor material;

(b) selecting an initial implant dose for each of the dopant species;

(c) implanting the selected initial dose for each of the dopant species into the semiconductor material;

(d) processing the semiconductor material to produce a processed semiconductor material;

(e) measuring a distribution of each of the implanted dopant species within the processed semiconductor material;

(f) selecting an initial value of a proportionality factor for each possible pair-wise combination of the selected dopant species, the selected proportionality factor value being a function of the distributions of the dopant species measured in (e) and being selected so that the value will produce a distribution of the dopant species which is substantially equal to the distributions measured in (e) when the selected factor is used to generate a diffusion equation of the form $$\frac{\partial C}{\partial t} = \nabla \cdot (D \nabla C) - \nabla \cdot J,$$

where $\partial$ is a partial derivative of the indicated variable, C is the distribution profile of one of the dopant species in the pair-wise combination of dopant species, D is a diffusion coefficient of the dopant species having a distribution profile C, $\nabla C$ is a gradient of C, $\nabla \cdot$ is an operator representing a divergence of the indicated variable, and J is a flux density term which is proportional to the selected factor;

(g) selecting a new implant dose for each of the dopant species;

(h) generating new proportionality factors corresponding to each of the new implant doses for each dopant species, wherein the new factors are obtained by scaling the previous factor for that species in proportion to the new implant dose for that species;

(i) forming a plurality of total force terms having components along three mutually perpendicular axes and representing the total force experienced by a first dopant species of each pair of dopant species at a given point in the semiconductor material at a given time as a result of its interactions with a second dopant species of each pair of dopant species, each component of the total force term being substantially equal to the product of the new proportionality factors generated in (h) and the difference between the amount of the second dopant species within the semiconductor in one direction along the axis corresponding to that component of the total force term from the projection of the given point on that axis and the amount of the second dopant species in an opposite direction along that axis from the projection of the given point along that axis, wherein the total force terms are used to generate a plurality of diffusion equations of the form described in (f), and further wherein, the flux density terms in the diffusion equations are proportional to the total force terms;

(j) selecting a set of process parameters to be used in modeling the fabrication of the semiconductor device, wherein the set of process parameters are representative of those specified during the fabrication of the semiconductor device;

(k) solving the diffusion equations, thereby determining an expected distribution of each of the plurality of dopant species;

18

(l) repeating steps (g) through (k) of the method until the expected distribution of dopant species is approximately equal to the desired distribution of dopant species; and (m) fabricating the semiconductor device based on the implant doses and process parameters which produced the expected distribution of the dopant species which is approximately equal to the desired distribution of the dopant species.

8. The method of claim 7, wherein the flux density term J and the force term are related by $J=DCF/kT$, where F is the force term, k is Boltzmann's constant, and T is the absolute temperature of the semiconductor material and is one of the set of process parameters used in modeling the fabrication of the semiconductor device.

9. A method of determining the implantation parameters for a dopant implanted into a semiconductor substrate during the fabrication of a semiconductor device which will produce a desired distribution of that dopant within the substrate, the distribution of the dopant resulting in part from dopant-dopant interactions between the implanted dopant and another dopant within the substrate, the method comprising:

(a) selecting an initial dose for the dopant to be implanted;

(b) implanting the selected initial dose of the dopant into the substrate of semiconductor material, wherein the substrate contains a previously implanted dopant;

(c) processing the semiconductor substrate to form a processed semiconductor material;

(d) measuring the distribution of each of the dopant species within the processed semiconductor material;

(e) generating a value of a dopant-dopant interaction force factor for each possible pair-wise combination of the dopant species contained in the processed semiconductor material, the generated value being a function of the distributions of the dopant species measured in (d) and producing a distribution of the dopant species which is substantially equal to the distributions measured in (d) when a diffusion equation the solution of which provides a distribution profile of each dopant species as a function of time is solved, wherein the diffusion equation has the form $$\frac{\partial C}{\partial t} = \nabla \cdot (D \nabla C) - \nabla \cdot J,$$

where $\partial$ is a partial derivative of the indicated variable, C is the distribution profile of one of the dopant species, D is a diffusion coefficient of the dopant species having a distribution profile C, $\nabla C$ is a gradient of C, $\nabla \cdot$ is an operator representing a divergence of the indicated variable, and J is a flux density term which is proportional to a force term, and further, wherein the force term represents a force experienced by a first dopant species of each pair of dopant species at a given point in the semiconductor material at a given time as a result of its interactions with a second dopant species of each pair of dopant species and is represented as being substantially equal to the product of the dopant-dopant interaction force factor and the difference between the amount of the second dopant species extending in one direction from the given point and the amount of the second dopant species extending in an opposite direction from the given point;

(f) selecting a new implant dose for the dopant implanted in step (a);

(g) generating a new dopant-dopant interaction force factor for each possible pair-wise combination of the dopant species contained in the substrate, the new factor depending upon the new implant dose selected in step (f), wherein the new force factor is obtained by scaling the previous force factor for that species in proportion to the new implant dose selected in (f);

(h) forming a force term based on the definition of a force term given in (e) and the new dopant-dopant interaction force factor generated in (g) for each pair-wise combination of dopant species, from which are formed a plurality of diffusion equations of the form given in (e), the solutions of the diffusion equations providing the distribution profile of each dopant species as a function of time;

(i) solving the plurality of diffusion equations formed in (h) to produce an expected distribution profile of each of the dopant species; and (j) repeating steps (f) through (i) of the method until the expected distribution of the dopant species is approximately equal to the desired distribution of the dopant species.

10. The method of claim 9, wherein prior to the solution of the diffusion equations, the method further comprises the steps of:

selecting a set of process parameters to be used in solving the diffusion equations, wherein the set of process parameters are representative of those specified during the fabrication of a semiconductor device; and solving the diffusion equations, wherein the solutions of the equations depend upon the selected set of process parameters.

11. The method of claim 10, wherein the implant parameters and process parameters obtained from the method are used to fabricate the semiconductor device having the desired distribution of dopants.

12. The method of claim 10, wherein the flux density term J and the force term are related by $$J = DCF/kT, \text{ where}$$

F is the force term, k is Boltzmann's constant, and T is the absolute temperature of the semiconductor material and is one of the set of process parameters used in solving the diffusion equations.

* * * * *